US012237374B2

(12) United States Patent
Rahimo et al.

(10) Patent No.: US 12,237,374 B2
(45) Date of Patent: Feb. 25, 2025

(54) SEMICONDUCTOR DEVICE AND METHOD FOR PRODUCING SAME

(71) Applicant: mqSemi AG, Zug (CH)

(72) Inventors: Munaf Rahimo, Gaensbrunnen (CH); Iulian Nistor, Niederweningen (CH)

(73) Assignee: mqSemi AG, Zug (CH)

( * ) Notice: Subject to any disclaimer, the term of this patent is extended or adjusted under 35 U.S.C. 154(b) by 351 days.

(21) Appl. No.: 17/626,798

(22) PCT Filed: Jul. 10, 2020

(86) PCT No.: PCT/EP2020/069656
§ 371 (c)(1),
(2) Date: Jan. 12, 2022

(87) PCT Pub. No.: WO2021/009077
PCT Pub. Date: Jan. 21, 2021

(65) Prior Publication Data
US 2022/0352315 A1 Nov. 3, 2022

(30) Foreign Application Priority Data

Jul. 12, 2019 (GB) ..................................... 1910012

(51) Int. Cl.
H01L 29/06 (2006.01)
H01L 29/10 (2006.01)
(Continued)

(52) U.S. Cl.
CPC ...... H01L 29/0696 (2013.01); H01L 29/1095 (2013.01); H01L 29/401 (2013.01);
(Continued)

(58) Field of Classification Search
CPC ............. H01L 29/0696; H01L 29/0649; H01L 29/1095; H01L 29/401; H01L 29/407;
(Continued)

(56) References Cited

U.S. PATENT DOCUMENTS 10,686,062 B2 * 6/2020 Bobde ............... H01L 29/66333
2002/0175351 A1 11/2002 Baliga
(Continued)

FOREIGN PATENT DOCUMENTS

KR 1759241 B1 * 8/2017 ....... H01L 21/82345
WO 2011157814 A2 12/2011

OTHER PUBLICATIONS

Kang, Power IGBT with dual gate and manufacturing method thereof, 2017, machine translation of KR 101759241 B1, pp. 1-6. (Year: 2017).*

(Continued)

Primary Examiner — Natalia A Gondarenko
(74) Attorney, Agent, or Firm — Tarolli, Sundheim, Covell & Tummino LLP

(57) ABSTRACT

In this patent application, a new Metal Oxide Semiconductor MOS planar cell design concept is proposed. The inventive power semiconductor includes a planar cell forming a horizontal channel and a plurality of trenches, which are arranged orthogonally to the plane of the planar cells. A second p base layer is introduced which extends perpendicularly deeper than the source region and laterally to the same distance/extent as the source region. Therefore, a vertical channel is prevented from forming in the trench regions while allowing the horizontal channels to form. This is extremely important in order to avoid significant issues (i.e. shifts in Vth) encountered in prior art IGBT designs. The new cell concept adopts planar MOS channel and Trench technology in a single MOS cell structure. The new design offers a wide range of advantages both in terms of performance (reduced losses, improved controllability and reliability), and processability (narrow mesa design rules, reliable planar process compatibility) and can be applied to both IGBTs and MOSFETs based on silicon or wide bandgap materials such as Silicon Carbide SiC. Furthermore, the (Continued)

device is easy to manufacture, because the inventive design can be manufactured based on a self-aligned process with minimum number of masks, with the potential of additionally applying enhancement layers and/or reverse conducting type of structures.

10 Claims, 36 Drawing Sheets

(51) Int. Cl.
*H01L 29/40* (2006.01)
*H01L 29/423* (2006.01)
*H01L 29/66* (2006.01)
*H01L 29/739* (2006.01)
*H01L 29/78* (2006.01)

(52) U.S. Cl.
CPC .... *H01L 29/4236* (2013.01); *H01L 29/66325* (2013.01); *H01L 29/66704* (2013.01); *H01L 29/7393* (2013.01); *H01L 29/7825* (2013.01)

(58) Field of Classification Search
CPC ........... H01L 29/4236; H01L 29/66325; H01L 29/66704; H01L 29/7393; H01L 29/7825; H01L 29/167; H01L 29/207; H01L 29/417; H01L 29/41708; H01L 29/0821; H01L 29/0804; H01L 29/0834; H01L 29/6634; H01L 29/7396; H01L 29/66484; H01L 29/7801; H01L 29/7813; H01L 29/7375; H01L 29/7395; H01L 29/7397; H01L 29/66333–66348; H01L 27/0664; H01L 27/0629
USPC .......................... 257/288, 139, 334, E27.101
See application file for complete search history.

(56) References Cited

U.S. PATENT DOCUMENTS

| | | | |
|---|---|---|---|
| 2013/0181280 A1* | 7/2013 | Sdrulla | H01L 29/66666 257/329 |
| 2014/0332845 A1 | 11/2014 | Bobde | |
| 2016/0163854 A1 | 6/2016 | Nishimura | |
| 2016/0359029 A1 | 12/2016 | Zeng | |
| 2016/0365413 A1* | 12/2016 | Wagner | H01L 29/41766 |
| 2017/0110449 A1* | 4/2017 | Gejo | H01L 29/0696 |
| 2017/0243962 A1 | 8/2017 | Lu | |
| 2018/0204909 A1* | 7/2018 | Konishi | H01L 29/1095 |
| 2020/0212208 A1* | 7/2020 | Sin | H01L 29/0804 |
| 2021/0013330 A1* | 1/2021 | Liu | H01L 29/42356 |

OTHER PUBLICATIONS

International Search Report dated Nov. 2, 2020 for corresponding International Application No. PCT/EP2020/069656.

* cited by examiner

B-B'

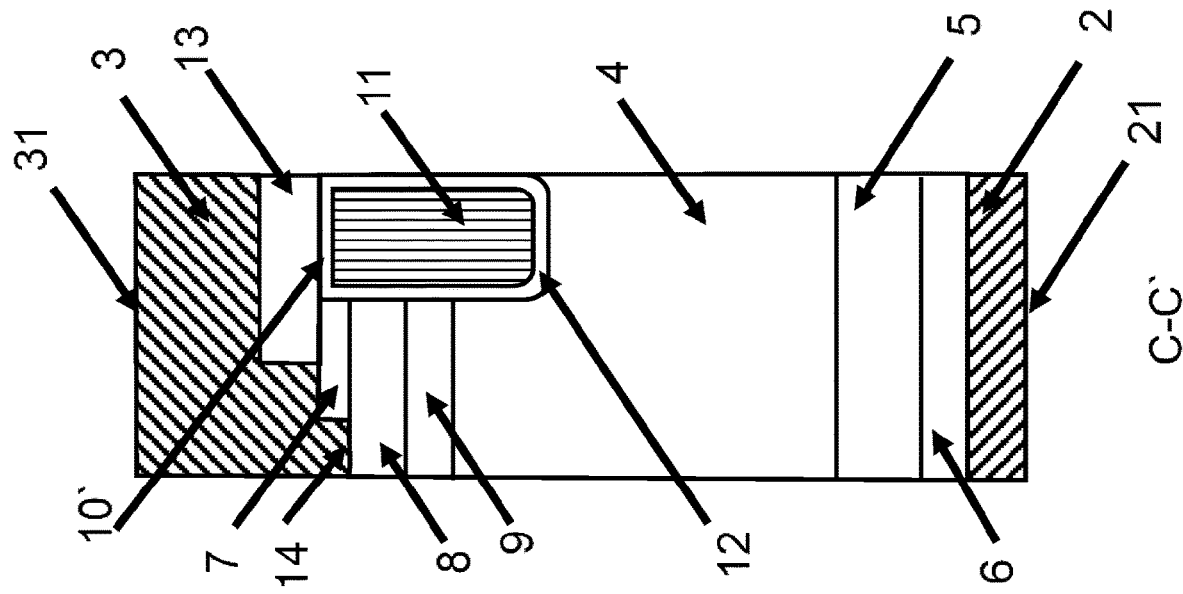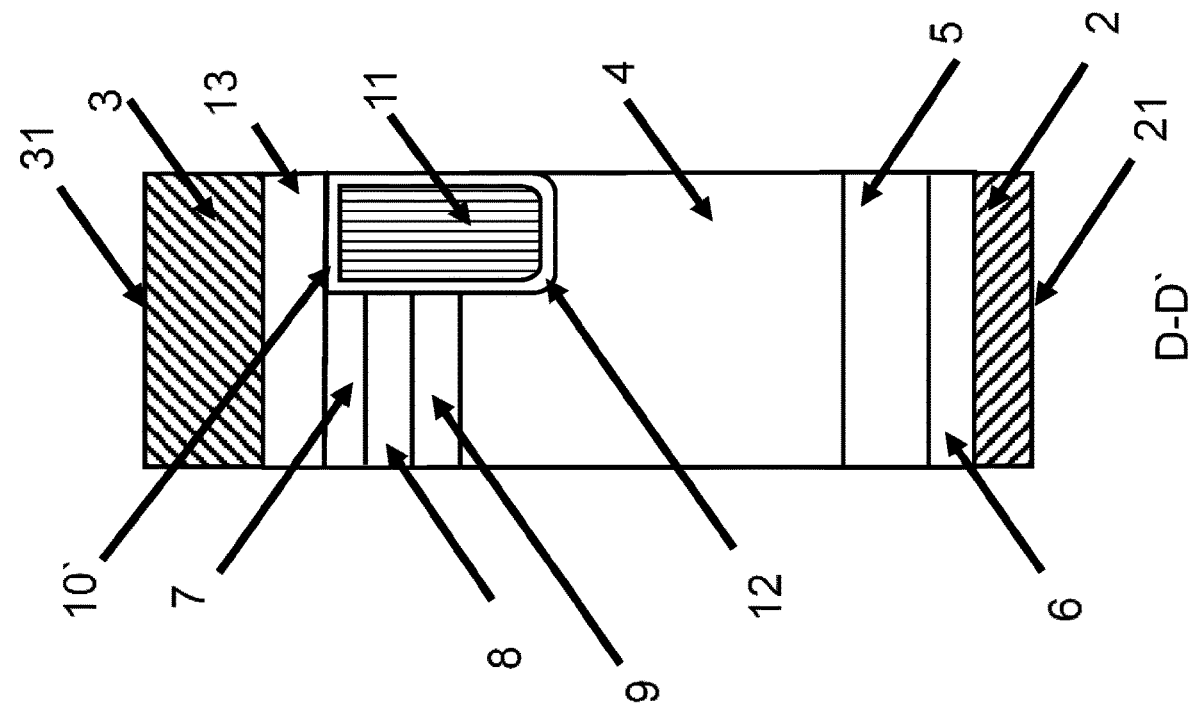
Figure 15

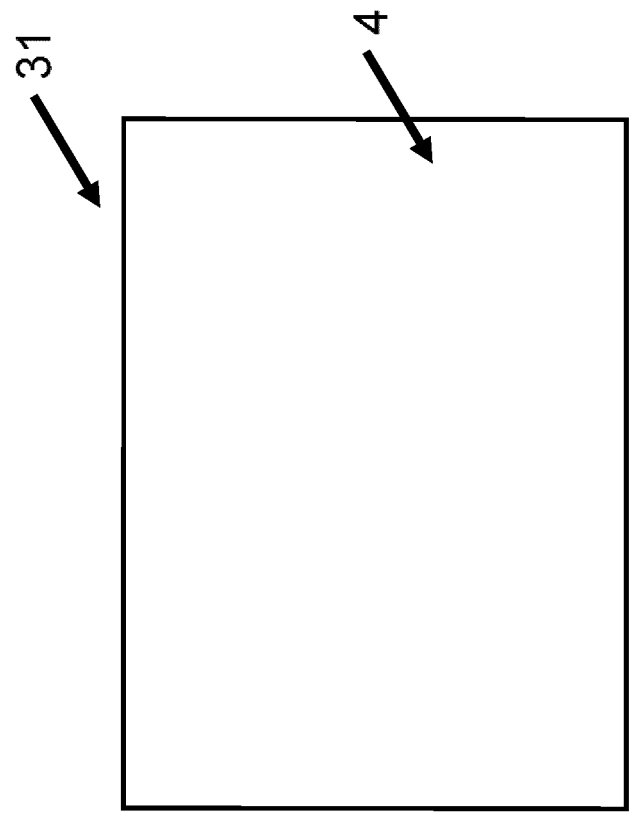
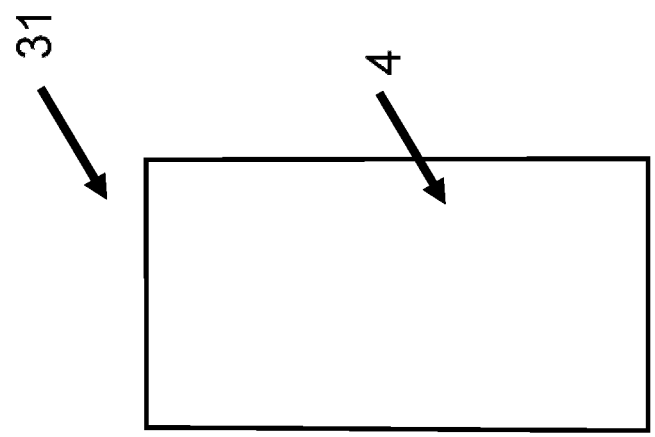
Figure 18

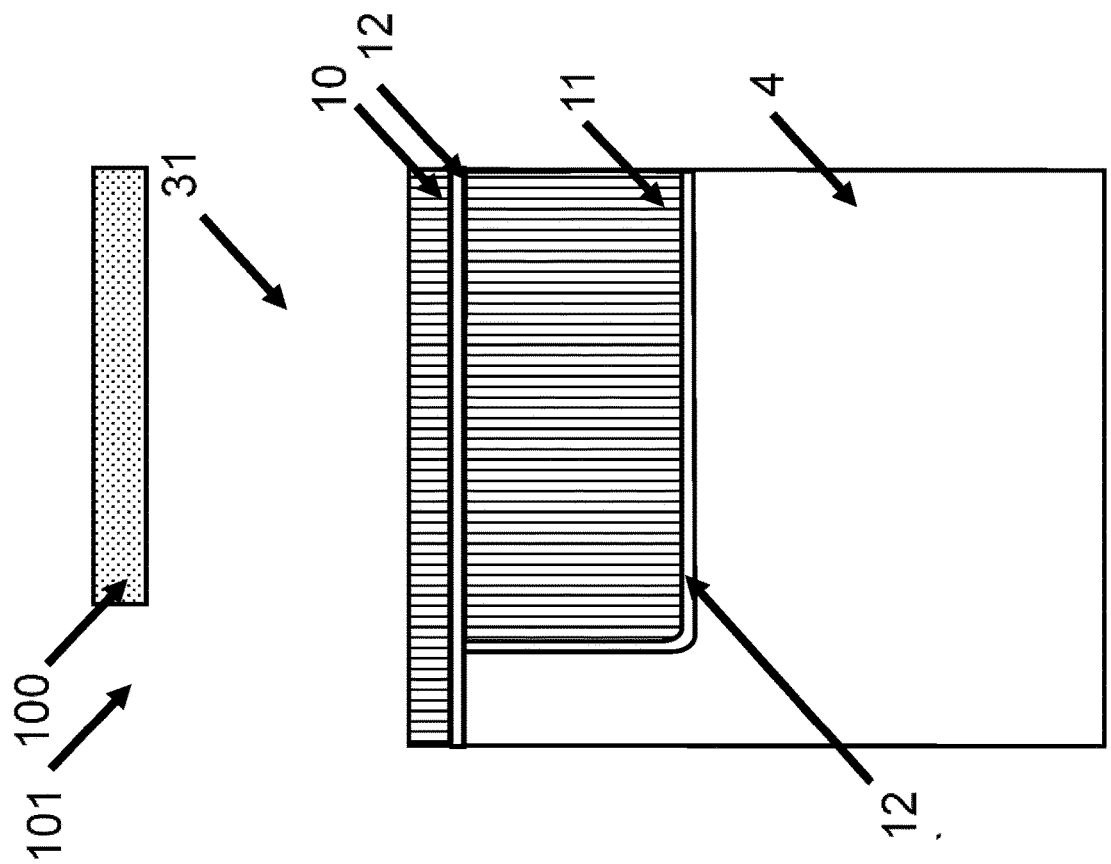
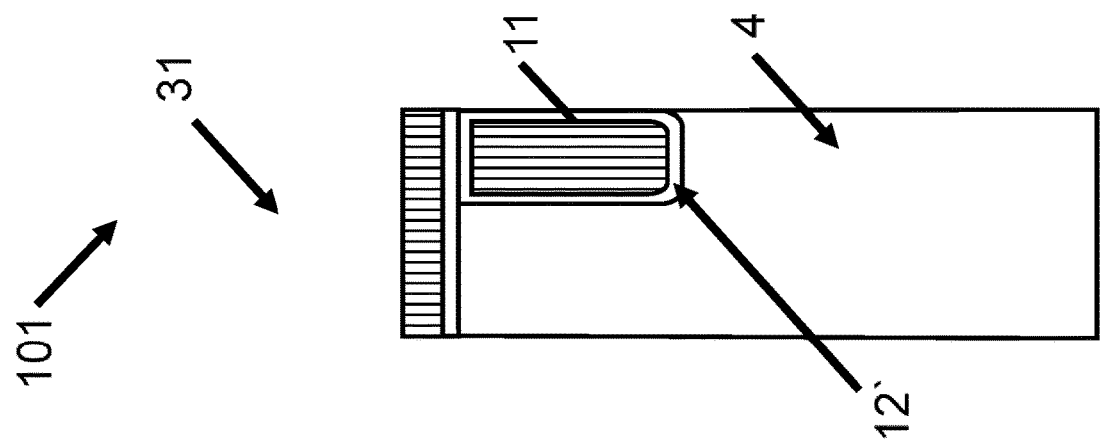
Figure 21

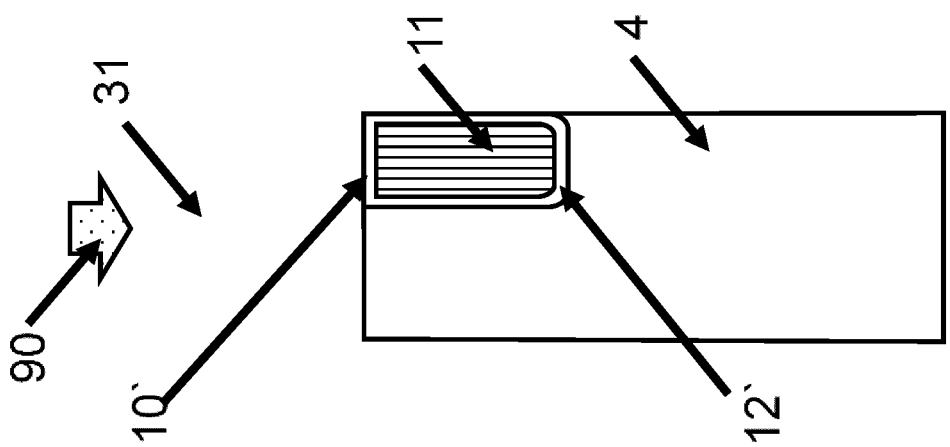
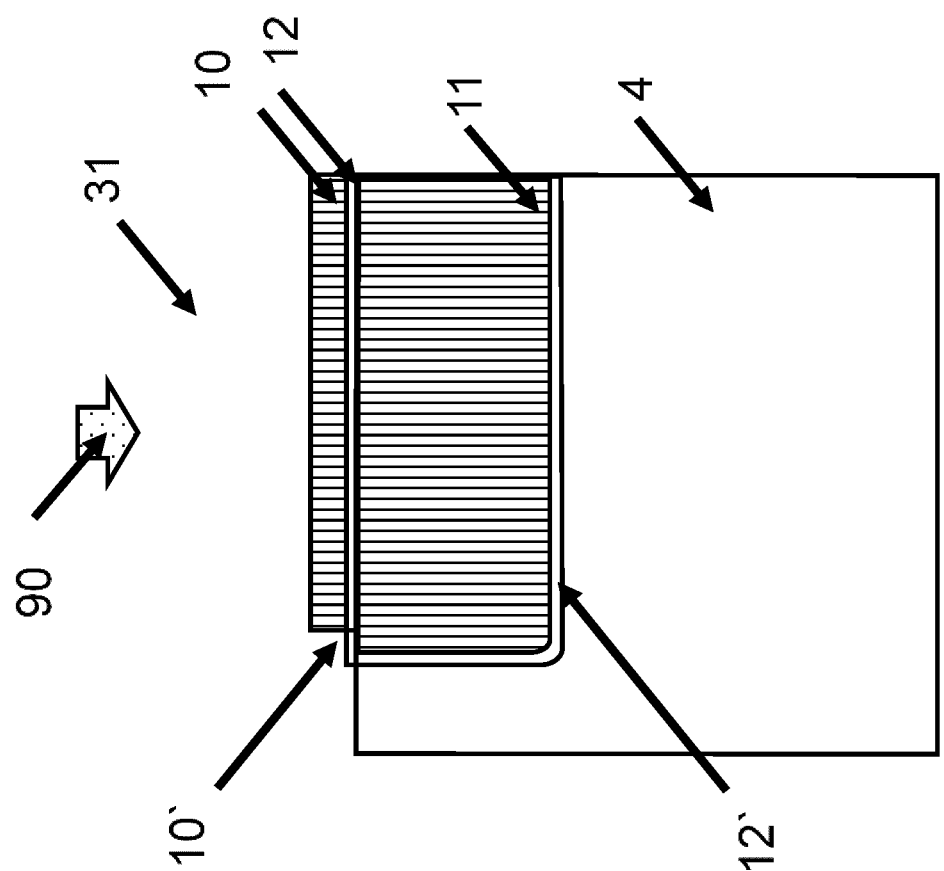
Figure 22

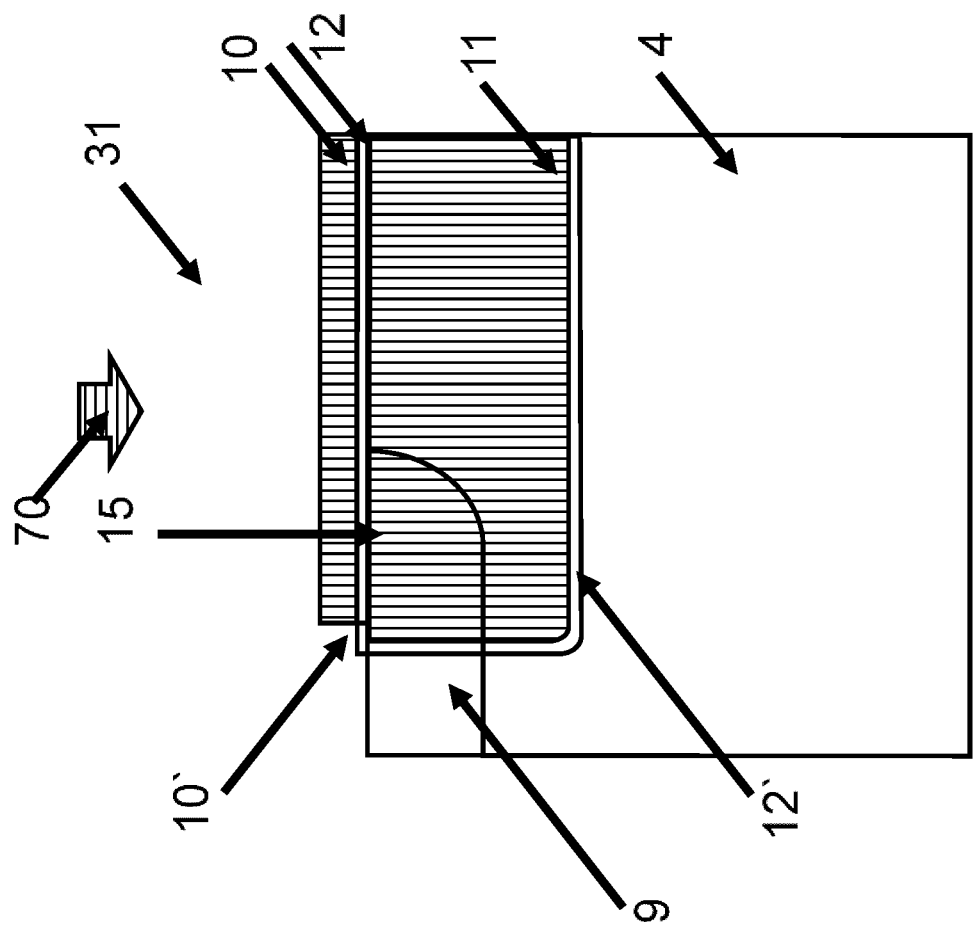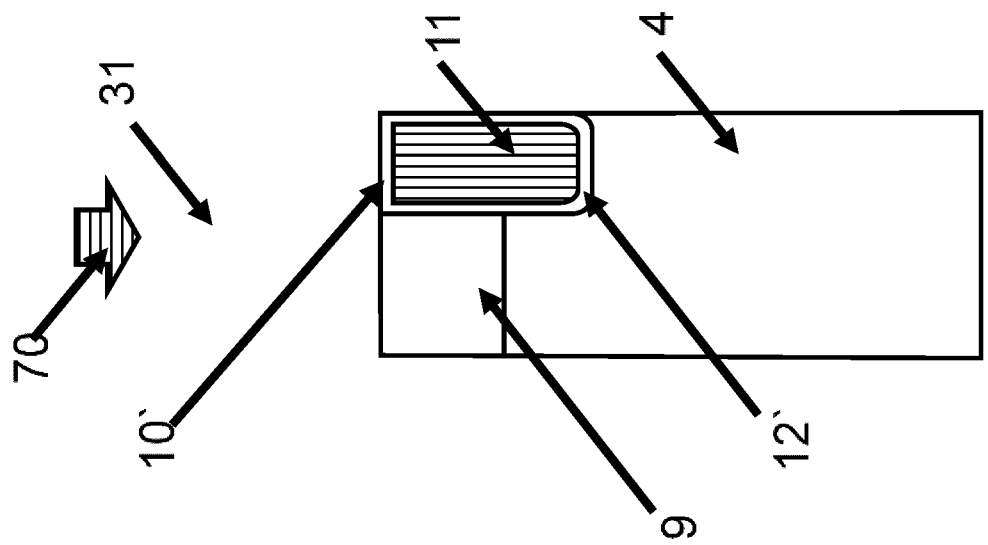
Figure 23

SEMICONDUCTOR DEVICE AND METHOD FOR PRODUCING SAME

RELATED APPLICATIONS

The present application is a U.S. National Stage application under 35 USC 371 of PCT Application Serial No. PCT/EP2020/069656, filed on 10 Jul. 2020; which claims priority from GB Patent Application No. 1910012.2, filed 12 Jul. 2019, the entirety of both of which are incorporated herein by reference.

FIELD OF THE INVENTION

The invention relates to the field of power semiconductor devices. It relates to a power semiconductor device with layers of different conductivity types and a method for producing such a semiconductor device.

TECHNICAL BACKGROUND

Planar and Trench MOS cell designs exhibit a number of advantages and disadvantages for IGBT and MOSFET designs. For IGBTs, typical Planar and Trench designs are shown in FIGS. 1A and 2A. Both designs can incorporate an enhancement n-type layer for improved excess carrier storage as shown in FIGS. 1B and 2B.

FIG. 1A shows a prior art IGBT with planar gate electrodes in accordance to U.S. Pat. No. 5,795,793. The IGBT 200 is a device with a four-layer structure, which are arranged between an emitter electrode 3 on an emitter side 31, and a collector electrode 2 on a collector side 21, which is arranged opposite of the emitter side 31. An (n-) doped drift layer 4 is arranged between the emitter side 31 and the collector side 21. A p doped planar base layer 9 is arranged between the drift layer 4 and the emitter electrode 3, which planar base layer 9 is in direct electrical contact with the emitter electrode 3. A planar n-doped source region 7 is arranged on the emitter side 31, embedded into the planar base layer 9, and in contact with the emitter electrode 3 through the contact opening 14. In addition, a planar p doped region 8 is arranged on the emitter side 31, below region 7, and embedded into the planar base layer 9. A contact opening 14 is formed for the emitter electrode 3 extending through region 7 to region 8.

A planar gate electrode 10 is arranged on top of the emitter side 31. The planar gate electrode 10 is electrically insulated from the planar base layer 9, the planar source region 7 and the drift layer 4 by a planar insulating layer 12. There is a further insulating layer 13 arranged between the planar gate electrode 10 and the emitter electrode 3.

The planar cell concept offers a lateral MOS channel 15 which suffers from non-optimal charge spreading (so called JFET effect) near the cell resulting in low carrier enhancement and higher conduction losses. Furthermore, due to the lateral channel design, the planar cell design suffers also from the PNP bipolar transistor hole drain effect (PNP effect) due to the bad electron spreading out of the MOS channel. However, the accumulation layer between the MOS cells offers strong charge enhancement for the PIN diode part (PIN effect). The planar design also requires more area resulting in less cell packing density for reduced channel resistance.

On the other hand, the planar design provides good blocking capability due to low peak fields at the cell and in between. The planar design can also provide good controllability and low switching losses and the cell densities in planar designs are easily adjusted for the required short circuit currents. Due to the fact that there exist few high peak electric fields in the gate oxide regions, the planar design offers good reliability with respect to parameter shifting during operation under high voltages. Also, the introduction of enhanced layers in planar cells has resulted in lower losses rivalling those achieved with trench designs as explained below.

The trench cell concept for a trench IGBT 300 shown in FIG. 2b offers a vertical MOS channel 16 which provides enhanced injection of electrons in the vertical direction and suffer from no drawbacks from charge spreading (JFET effect) near the cell. Therefore, the trench cells show much improved carrier enhancement for lower conduction losses. Due to the vertical channel design, the trench offers also less hole drain effect (PNP effect) due to the improved electron spreading out of the MOS channel. Modern trench designs adopting mesa widths (trench to trench distance) below 1 μm achieve very low conduction losses since closely packed trenches can provide a strong barrier to hole drainage. Matching such a performance with less complex processes can be of a great advantage. The accumulation layer at the bottom of the trench offers strong charge enhancement for the PIN diode part.

Hence wide and/or deep trenches show optimum performance. Furthermore, the trench design offers large cell packing density for reduced channel resistance.

However, the trench design suffers from lower blocking capability near the bottom corners of the trenches due to high peak electric fields. This has also resulted in parameter shifting during operation due to hot carrier injection into the gate oxide. The trench design has also a large MOS accumulation region and associated capacitance resulting in bad controllability and high switching losses. The high cell densities in trench designs will also result in high short circuit currents. Finally, gate parameter shifts can occur under normal gate biasing stress conditions due to the trench etch process in relation to the silicon crystal orientation and the critical region at the n-source and p-base junction which is formed at the trench gate oxide 12' which defines the device MOS parameters.

Hence, optimising the trench design to overcome the above drawbacks has normally resulted in higher losses when compared to the initial loss estimations and potential of trench designs. Many trench designs have been proposed with particular focus on the regions between the active MOS cells for lowing the losses and improving the device controllability. Another approach in previous inventions combines planar and trench designs were proposed to obtain the advantage of the planar designs (region between the cells) and trench designs (the cell) while eliminating some of the drawbacks of the planar and trench designs.

In U.S. Pat. No. 9,064,925B2, the Trench Planar IGBT 600 shown in FIG. 3 combines both a planar and trench MOS cells in a single design. However, both the planar channel 15 and trench channel 16 are separated. Similarly, in "Trench emitter IGBT with lateral and vertical MOS channels" (Proc. 23rd Internat. Conf. on Microelectronics MIEL 2002, 163-166) an IGBT is described, which comprises trench gate electrodes and planar gate electrodes in one device.

A Trench Planar MOSFET cell (Solid State Electronics, V38, No 4, page 821-828, 1995) represents the first publication of Trench Planar MOS cell design. A similar design was published as a Trench Planar IGBT (IEEE Electron Device Letters, Vol 20, No. 11, November 1999, page 580). The Trench Planar IGBT 400 design shown in FIG. 4A consist only of a planar channel and proposes a trench structure to improve carrier accumulation. The concept proposed shallow trenches for improved blocking capability. In U.S. Pat. No. 9,093,522B2, a similar Trench Planar design 401 with an enhancement layer 17 described with an embodiment where the channel extends to include trench section 16 as shown in FIG. 4B. The channels are formed with a gaussian doping profile with the maximum doping region near the n-source p-base junction which defines the device MOS parameter. Hence, the trench channel will be very lightly doped and will have little impact on the device operation. In U.S. Pat. No. 8,441,046B2, A Planar Trench MOS IGBT 500 with an enhancement layer was described as shown in FIG. 5. Similar to the Trench Planar NOS cell described above, the Planar Trench design includes a planar channel 15 and a trench channel 16 with the trench channel having higher doping levels compared to the Trench Planar design. U.S. Pat. No. 8,441,046B2 also describes a Trench Shielded Planar version where the trench is grounded (not connected to the gate) and in one version cuts orthogonally through the planar cell.

The majority of the above patents describe an active trench connected to the gate in combination with a planar channel in a two-dimensional arrangement.

In a closely related prior art to the present invention, U.S. Pat. No. 6,380,586B1 describes a trench IGBT 700 where planar channels 15 are orthogonally positioned in relation to the trench regions as shown in FIG. 6 for an embodiment having a discontinued trench at the emitter contact 3. A continuous trench cutting through the emitter contact 3 was also described. The main feature of this structure is the trench channel 16 which will provide electron injection in both lateral and vertical dimensions at the trench wall as shown in the cross-section B-B' as shown in FIG. 7. Such a device will have different MOS parameters such as the threshold voltage for the vertical and lateral channels. Furthermore, for the discontinued version, the trench MOS channel 16 at the trench periphery near 10' can become critical due to the sharp trench curvature in that region.

To overcome the above issues, U.S. Pat. No. 9,640,644 describes a planar cell structure 800 where the n-source regions 7 are separated from the trench by a highly doped p-region 8 which also extend along the trench orthogonal dimension for achieving higher turn-off capability as shown in FIG. 8. Hence, only a planar channel 15 is formed in this structure and no vertical channel along the trench oxide 12' is present as shown in FIG. 9 for the cross-section B-B'.

However, this device will not provide lower conduction losses and the highly doped p-regions can result in high hole drainage levels.

The structures described above also suffer from complex and critical alignment process steps such as n-source 7 and p-region 8 structuring which can also increase the cost and limit the option to reduce the cell dimensions for providing lower losses.

It is desirable to find a new MOS cell design concept that can still benefit from the combination of the trench and planar MOS cell concepts while enabling simple process steps and lower conduction/on-state losses.

SUMMARY

We herein describe a power semiconductor, comprising a drift layer of a first conductivity type, which is arranged between the emitter side and the collector side, a first base layer of a second conductivity type, which is arranged between the drift layer and the emitter electrode, a source region of the first conductivity type, which is arranged at the emitter side embedded into the first base layer and contacts the emitter electrode, which source region has a higher doping concentration than the drift layer, and extends to the first and second gate electrode, a second base layer of the second conductivity type, which is arranged at the emitter side embedded into the first base layer and is situated perpendicularly deeper than the source region and laterally to the same distance/extent as the source region, and contacts the emitter electrode through a contact opening, which second base layer region has a higher doping concentration than the first base layer and extends to the second gate electrode, a first gate electrode, which is arranged on top of the emitter side and the first gate electrode is electrically insulated from the first base layer, the source region and the drift layer by a first insulating layer, an horizontal channel is formable between the emitter electrode, the first source region, the first base layer and the drift layer, a plurality of second gate electrodes, each of which is electrically insulated from the first base layer, second base layer, source region and the drift layer by a second insulating layer and which second gate electrode is arranged orthogonally to the plane of the first base layer, second base layer and source region and extends deeper into the drift layer than the first base layer, a vertical channel is not formable between the emitter electrode, the source region, the first base layer and the drift layer.

The power semiconductor may further comprise trenches shaped with respective stripes. The first base layer, the source region and the second base layer may be shaped with respective stripes in orthogonal direction to the stripes of the trenches, and the stripe of the first base layers, source region and second base layer is divided into rectangles spaced apart from each other by the stripes of the trenches.

Alternatively, the first base, source region and second base layer are shaped with respective stripes, the trenches are shaped with respective stripes in orthogonal direction to the stripes of the first base layer, source region and second base layer, and the stripe of the trenches is divided into rectangles spaced apart from each other by the stripes of the first base layer, source region and second base layer.

Optionally, the first and second gate electrodes are electrically connected. Additionally or alternatively, all or some of the second gate electrodes are electrically connected to the emitter electrode and/or all or some of the second gate electrodes are electrically floating.

The power semiconductor device may further comprise a buffer layer of the first conductivity type with a higher doping concentration than the drift layer, arranged between the drift layer and the collector electrode and/or a collector layer of the second conductivity type arranged on the collector side between the drift layer and the collector electrode.

We also describe a power semiconductor device comprising a buffer layer of the first conductivity type with a higher doping concentration than the drift layer, which buffer layer is arranged on the collector side between the drift layer and the collector electrode; and a collector layer of the second conductivity type, which is arranged on the collector side between the buffer layer and the collector electrode.

The power semiconductor device may comprise first dopants which are preferably boron ions and are driven into a maximum depth between 1 μm and 5 μm, in particular between 1 and 3 μm and in particular between 1 and 2 μm.

The power semiconductor device may comprise second dopants which are preferably Phosphorous or Arsenic ions and driven into a maximum depth between 0.5 μm and 1 μm.

The power semiconductor device may comprise third dopants which are preferably Boron ions and are driven into a maximum depth between 0.5 µm and 1.5 µm and completely cover the lower part of the second region and ensure no vertical trench channel can be formed at the trench regions.

The power semiconductor device may comprise an enhancement layer of the first conductivity type arranged between, and thereby separating, the drift layer and the first base layer.

The power semiconductor device may comprise fourth dopants which are preferably Phosphorous ions and are driven into a maximum depth between 2 µm and 8 µm, in particular between 2 and 6 µm and in particular between 2 and 4 µm.

The power semiconductor may be a reverse conducting type device with a collector short layer of the first conductivity type arranged at the collector side between the collector electrode and buffer layer.

A distance between the second wall of the trench recess and the first wall of the adjacent trench in the lateral direction in the planar view may be in a range from about 5 µm to below 0.1 µm, more preferably from 1 µm to 0.1 µm A distance between adjacent trenches in the longitudinal direction of the trenches in the planar view extends approximately in a range from about 20 µm to about 1 µm, preferably from 5 µm to 1 µm, and more preferably from 2 µm to 1 µm.

The power semiconductor device may have a stripe layout design or cellular layout design.

We also describe herein a method for manufacturing a power semiconductor, the method comprising: providing a lowly doped wafer of a first conductivity type having an emitter side and a collector side, forming a drift layer; applying a mask and etching a trench recess on the first main side of the substrate of a first conductivity type; forming a first oxide layer on a first main side of a substrate of a first conductivity type; producing a structured gate electrode layer with at least one opening on the first main side on top of the first oxide layer; using the structured gate electrode layer on the first main side as a mask for implanting a first dopant of a second conductivity type, which is different than the first conductivity type, into the substrate on the first main side for forming a well; diffusing the first dopants into the substrate; using the structured gate electrode layer on the first main side as a mask for implanting second dopants of a first conductivity type into the substrate on the first main side; diffusing the second dopants to a lower depth than the first dopants for forming a source contact; using the structured gate electrode layer for implanting third dopants of a second conductivity type into the substrate on the first main side to a depth higher than the second dopants; diffusing the third dopants into the substrate, characterized in that, the third dopants are diffused to a lower depth than the first dopants; forming a second insulating layer on the first main side; etching a contact opening through the insulating layer and the second dopants and by filling a resulting contact opening with metal.

The first dopants are preferably implanted with an energy of 20-100 keV and/and a dose of $5\times10^{13}/cm^2$ to $2\times10^{14}/cm^2$.

The second dopants are preferably implanted with an energy of 100-160 keV and/and a dose of $1\times10^{15}/cm^2$ to $1\times10^{16}/cm^2$.

The third dopants are preferably implanted to a higher depth than the second region with an energy of 100-160 keV and a dose of $1\times10^{15}/cm^2$ to $1\times10^{16}/cm^2$.

Fourth dopants are preferably implanted with an energy of 20-100 keV and a dose of $5\times10^{12}/cm^2$ to $5\times10^{13}/cm^2$.

We also describe herein a semiconductor module package comprising a single or multiple power semiconductor devices as described above or manufactured using the method described above.

We also describe herein a converter with a plurality of power semiconductor devices as described above or manufactured using the method described above.

According to a first aspect of the invention, we describe a power semiconductor device comprising a first surface and a second surface separated in a first dimension, wherein an emitter electrode is operatively connected to the first surface and a collector electrode is operatively connected to the second surface, and wherein the power semiconductor device further comprises:
  a drift layer of a first conductivity type located between the first surface and the second surface;
  a first base layer of a second conductivity type arranged between the drift layer and the emitter electrode;
  a source region of the first conductivity type located within the first base layer and operatively connected to the emitter electrode, wherein a doping concentration of the source region is greater than a doping concentration of the drift layer;
  a second base layer of the second conductivity type located within the first base layer and under the source region, wherein a doping concentration of the second base layer region is greater than a doping concentration of the first base layer, wherein a first end of the second base layer is aligned with a first end of the source region in a second dimension and a second end of the second base layer extends beyond a second end of the source region in the second dimension, wherein the second end of the second base region is operatively connected to the emitter electrode via a contact opening;
  a first gate electrode located over the first base layer, the source region and the drift layer, wherein the first gate electrode is electrically insulated from the first base layer, the source region and the drift layer by a first insulating layer;
  a plurality of trench regions each comprising a second gate electrode and a second insulating layer, the second insulating layer electrically insulating the second gate electrode from the first base layer, the second base layer, the source region and the drift layer, wherein each trench region is located within the drift layer and extends beyond the first base layer in the first and second dimensions;
  wherein the second base layer is configured to prevent the formation of a first channel in the first dimension between the emitter electrode and the drift layer; and
  wherein the emitter electrode and the drift layer are separated in the second dimension by the first base layer and the source region, wherein the power semiconductor device is configured to form a second channel between the emitter electrode and the drift layer in the second dimension.

It will be understood that the first dimension corresponds to the direction of the separation of the emitter and collector electrodes, while the second dimension corresponds to the direction of the length of the trench regions. It will be further understood that the device may extend in a third dimension orthogonal to the first and second dimensions. The first, second and third dimensions generally align with the Y, Z and X dimensions respectively as shown in prior art FIG. 8.

It may be an object of the present invention to provide a Planar Insulated Gate Bipolar Transistor IGBT with improved electrical characteristics. Furthermore, it may be an object of the present invention to provide a method for producing such a planar semiconductor device.

These objects may be met by the subject matter of the independent claims. Embodiments of the invention are described with respect to the dependent claims.

It is an object of the invention to provide a power semiconductor device with reduced on-state losses, low drainage of holes, stable gate parameters, improved blocking capability, and good controllability.

The problem is solved by the semiconductor device with the characteristics of claim 1.

The inventive power semiconductor device has layers of different conductivity types, which layers are arranged between an emitter electrode on an emitter side and a collector electrode on a collector side, which is arranged opposite of the emitter side. The layers comprise:
  a drift layer of a first conductivity type, which is arranged between the emitter side and the collector side,
  a first base layer of a second conductivity type, which is arranged between the drift layer and the emitter electrode,
  a source region of the first conductivity type, which is arranged at the emitter side embedded into the first base layer and directly contacts the emitter electrode, which source region has a higher doping concentration than the drift layer, and extends to the first and second gate electrode
  a second base layer of the second conductivity type in contact with the emitter electrode, which second base layer is arranged at the emitter side embedded into the first base layer and is extending deeper in the drift layer than the source region, and laterally to the same distance/extent as the source region, which second base layer region has a higher doping concentration than the first base layer and extends to the second gate electrode
  a first gate electrode, which is arranged on top of the emitter side and is electrically insulated from the first base layer, the source region and the drift layer by a first insulating layer, an horizontal channel is formable between the emitter electrode, the first source region, the first base layer and the drift layer,
  a plurality of second gate electrodes, each of which is electrically insulated from the first base layer, second base layer, source region and the drift layer by a second insulating layer and which second gate electrode is arranged orthogonally to the longitudinal extension direction of the first base layer, second base layer and source region and extends deeper into the drift layer than the first base layer, a vertical channel is not formable between the emitter electrode, the source region, the first base layer and the drift layer, The inventive planar semiconductor device integrates a Trench into a Planar MOS cell in order to gain the advantages of both designs in terms of reduced on-state losses, low drainage of holes, stable gate parameters, improved blocking and good controllability.

The advantage of the planar gate design and trench design can be combined in the inventive semiconductor device while the disadvantages of the planar cell region and interspace between trench cells are eliminated.

Due to the fact that the area in between the orthogonal gate trenches does not need to be further structured, very high-density trenches can be used with trench mesa dimensions below 100 nm. This will significantly reduce the hole drainage effect as well known to those experts in the field.

In addition, for discontinued orthogonal gate trenches at the planar cell, the trench mesa dimension at the planar cell can be reduced to 1 µm for further reducing the hole drainage effect, while keeping the planar cell dimensions larger than 1 µm.

The second base layer under the source region will ensure that no vertical channel is formed in trench regions to ensure stable gate parameters and blocking capability. However, the trench will provide a lateral channel with improved vertical spreading.

Some or all of the plurality of second gate electrodes can be directly connected to the first gate electrodes, or can be grounded to the emitter electrode, or made floating. If the second gate electrodes gates are shorted to the emitter electrode, there is no voltage differential between the second gate electrodes and effectively no capacitance. Since the second gates do not invert the first base region, the cell containing the second gate is a passive type of cell, as opposed to an active cell controlled by the gate trenches. By controlling the number of passive cells, the input capacitance of the device can be precisely controlled.

Similarly, if the second gate electrodes are floating, resulting in a passive cell, the potential floats up to the emitter voltage so there is effectively no capacitance associated with the second gates.

Furthermore, the device is easy to manufacture, because the inventive design can be manufactured based on a self-aligned process with minimum a number of masks required.

The new design offers a wide range of advantages both in terms of performance (reduced losses, improved controllability and reliability), and processability (very narrow mesa design rules, reliable planar process compatibility) with the potential of applying enhanced layer structures. The inventive design is suitable for full or part stripes but can also be implemented in cellular designs.

The inventive design is especially suitable for reverse conducting structures because the elimination of the vertical trench channel, and the presence of the highly doped second base layer in the trench regions, will provide good diode injection levels, while reducing the impact of operating the diode with a positive gate bias and higher on-state losses.

The new design can be applied to both IGBTs and MOSFETs based on silicon or wide bandgap materials such as Silicon Carbide SiC.

According to a second aspect of the invention, we describe herein a method for manufacturing a power semiconductor device, the method comprising:
  providing a lowly doped wafer of a first conductivity type having an emitter side and a collector side, wherein the lowly doped wafer forms a drift layer;
  applying a mask and etching a trench region on the emitter side of the lowly doped wafer;
  forming a first oxide layer on the emitter side of the lowly doped wafer;
  producing a structured gate electrode layer with at least one opening above the first oxide layer;
  using the structured gate electrode layer as a mask for implanting a first dopant of a second conductivity type into the lowly doped wafer, thereby forming a well;
  diffusing the first dopants into the lowly doped wafer;
  using the structured gate electrode layer as a mask for implanting second dopants of the first conductivity type into the lowly doped wafer;
  diffusing the second dopants to a lower depth than the first dopants, thereby forming a source contact;

using the structured gate electrode layer as a mask for implanting third dopants of the second conductivity type into the lowly doped wafer to a depth higher than the second dopants;

diffusing the third dopants into the substrate, wherein the third dopants are diffused to a lower depth than the first dopants;

forming a second insulating layer above the emitter side of the lowly doped wafer;

etching a contact opening through the second insulating layer and the second dopants; and filling the contact opening with a metal.

Additional embodiments are defined by the dependent claims.

The inventive method for manufacturing a power semiconductor device comprises the following steps:

a trench region is produced by etching on the first main side of the substrate of a first conductivity type a first oxide layer is produced on a first main side of a substrate of a first conductivity type, a structured gate electrode layer with at least one opening is produced on the first main side on top of the first oxide layer, first dopants of a second conductivity type are is implanted into the substrate on the first main side and, the first dopants are diffused into the substrate, characterized in that, the structured gate electrode layer is used as a mask for implanting the first dopants, second dopants of a first conductivity type are is implanted into the substrate on the first main side and, the second dopants are diffused into the substrate, characterized in that, the structured gate electrode layer is used as a mask for implanting the second dopants, the second dopants are diffused to a lower depth than the first dopants, third dopants of a second conductivity type are is implanted into the substrate on the first main side and, the third dopants are diffused into the substrate, characterized in that, the structured gate electrode layer is used as a mask for implanting the third dopants, the third dopants are implanted to a higher depth than the second dopants and diffused to a lower depth than the first dopants, an insulating oxide layer is produced on the first main side, a contact opening is produced by etching through the insulating layer and the second dopants and by filling a resulting contact opening with metal The inventive method for manufacturing a power semiconductor device, in particular an IGBT or MOSFET, has the advantage that one single mask is needed for the manufacturing of the base layers and source layer, made by the implants and diffusions. These layers are self-aligned by using the structured gate electrode layer as a mask.

BRIEF DESCRIPTION OF THE DRAWINGS

The embodiments of the invention will be explained in more detail in the following text with reference to the attached drawings, in which:

FIG. 15: Cross section of FIG. 11 along C-C' and D-D'.

FIGS. 18-28: show a cross section of the different steps of the method for manufacturing a semiconductor device according to the invention.

DETAILED DESCRIPTION OF THE DRAWINGS

Figure 1A:
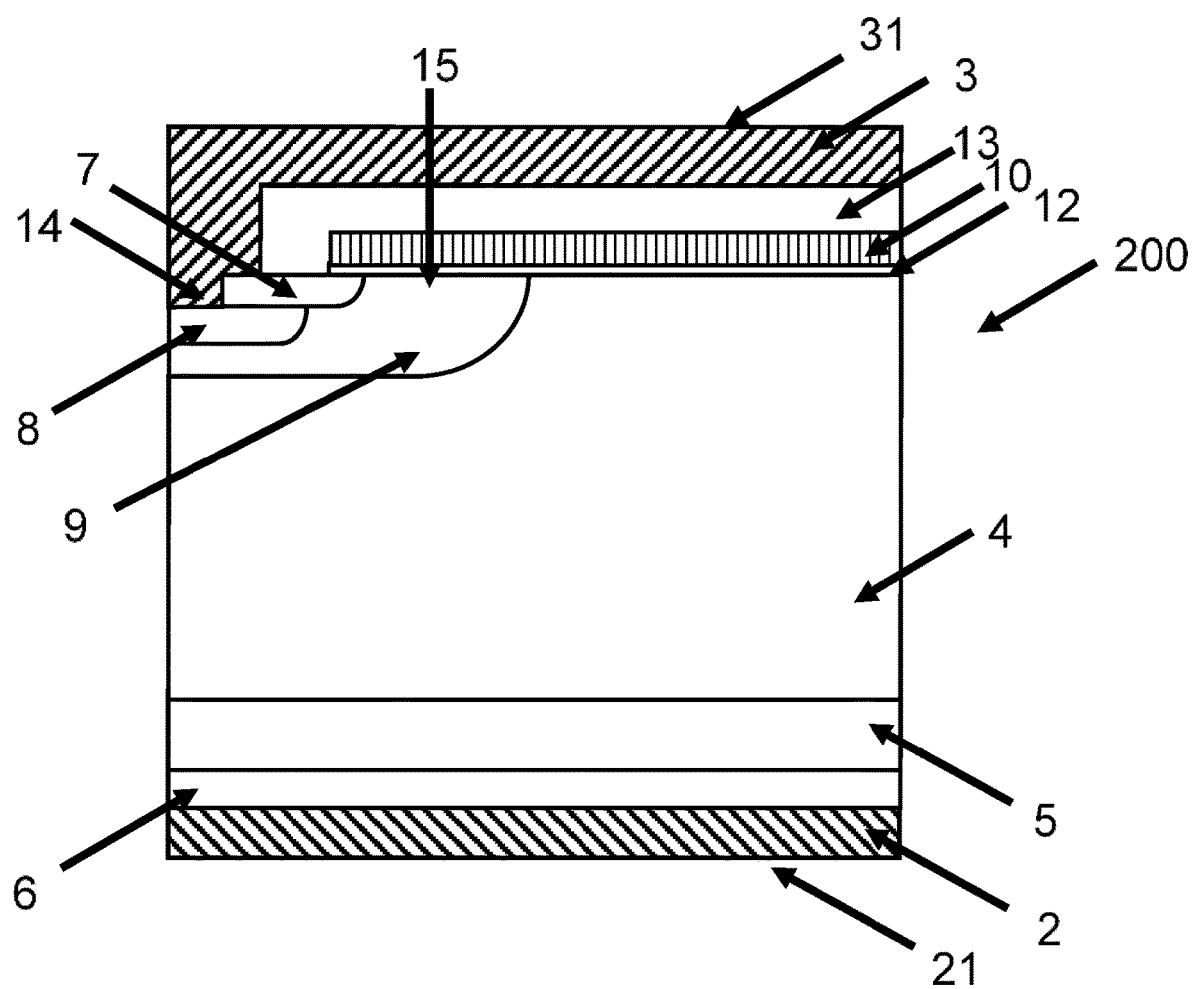
FIG. 1A-B: show the cross sections of Planar MOS IGBT structures.
Figure 1B:
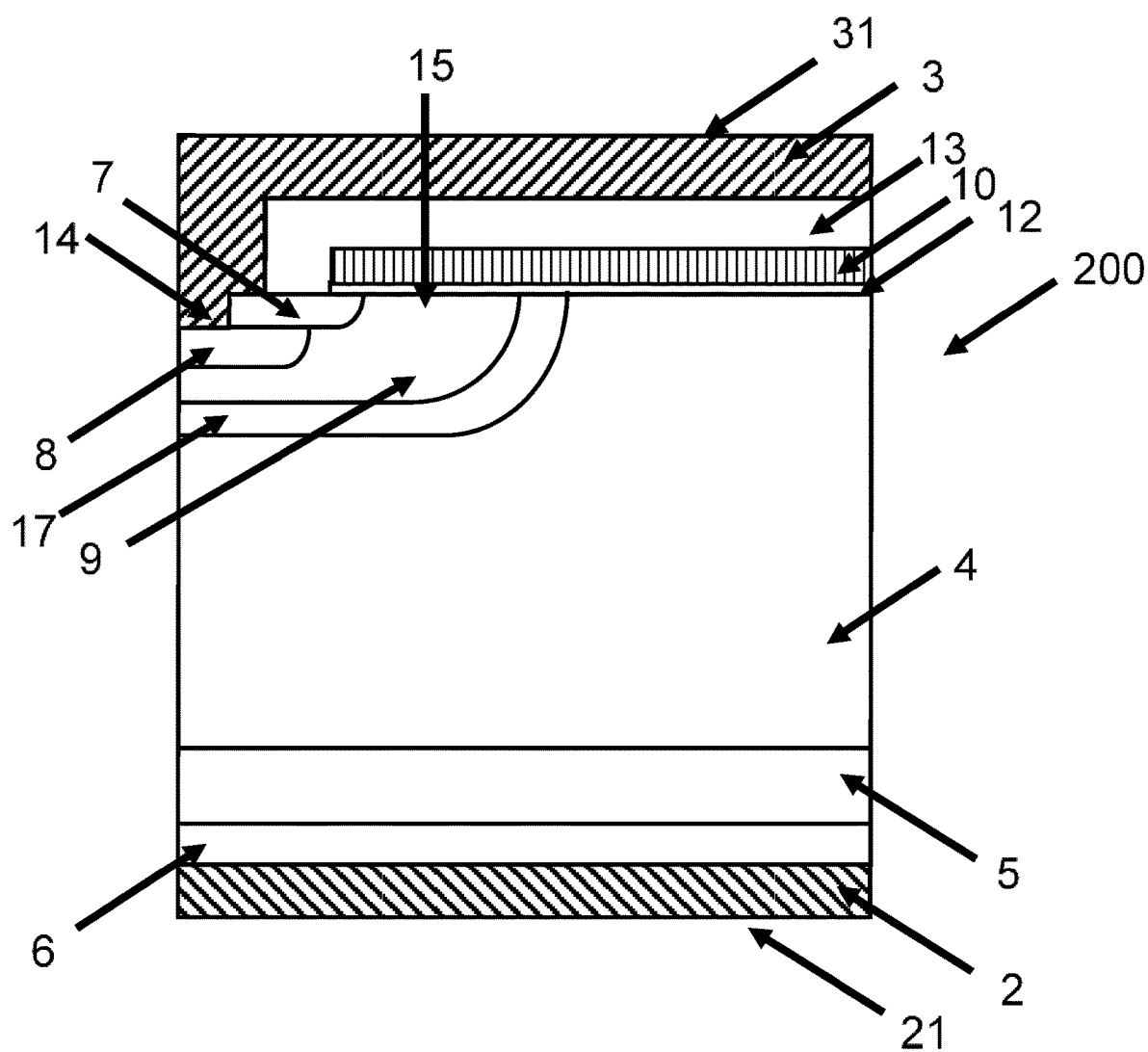
Figure 2A:
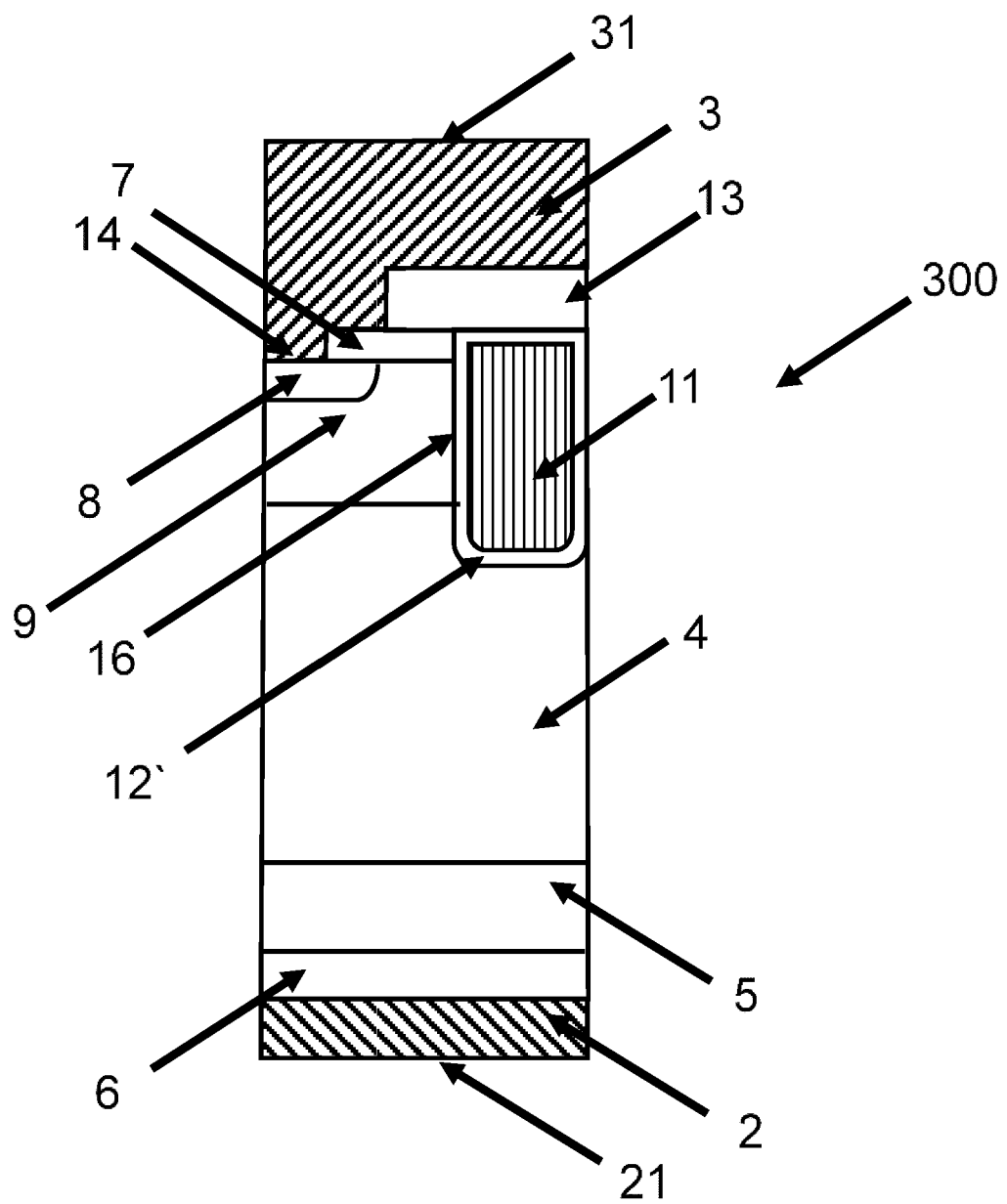
FIG. 2A-B: show the cross sections of Trench MOS IGBT structures.
Figure 2B:
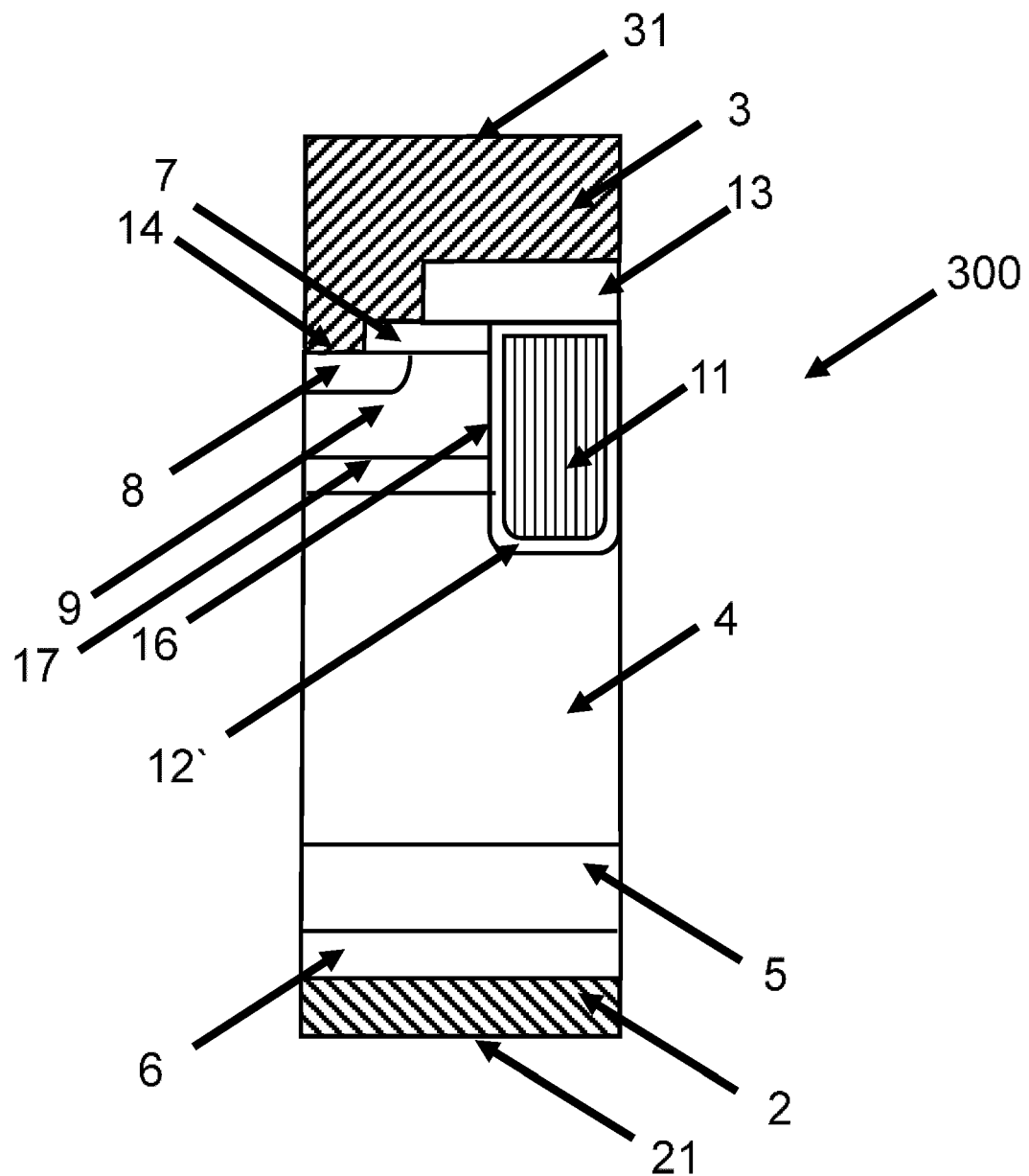
Figure 3:
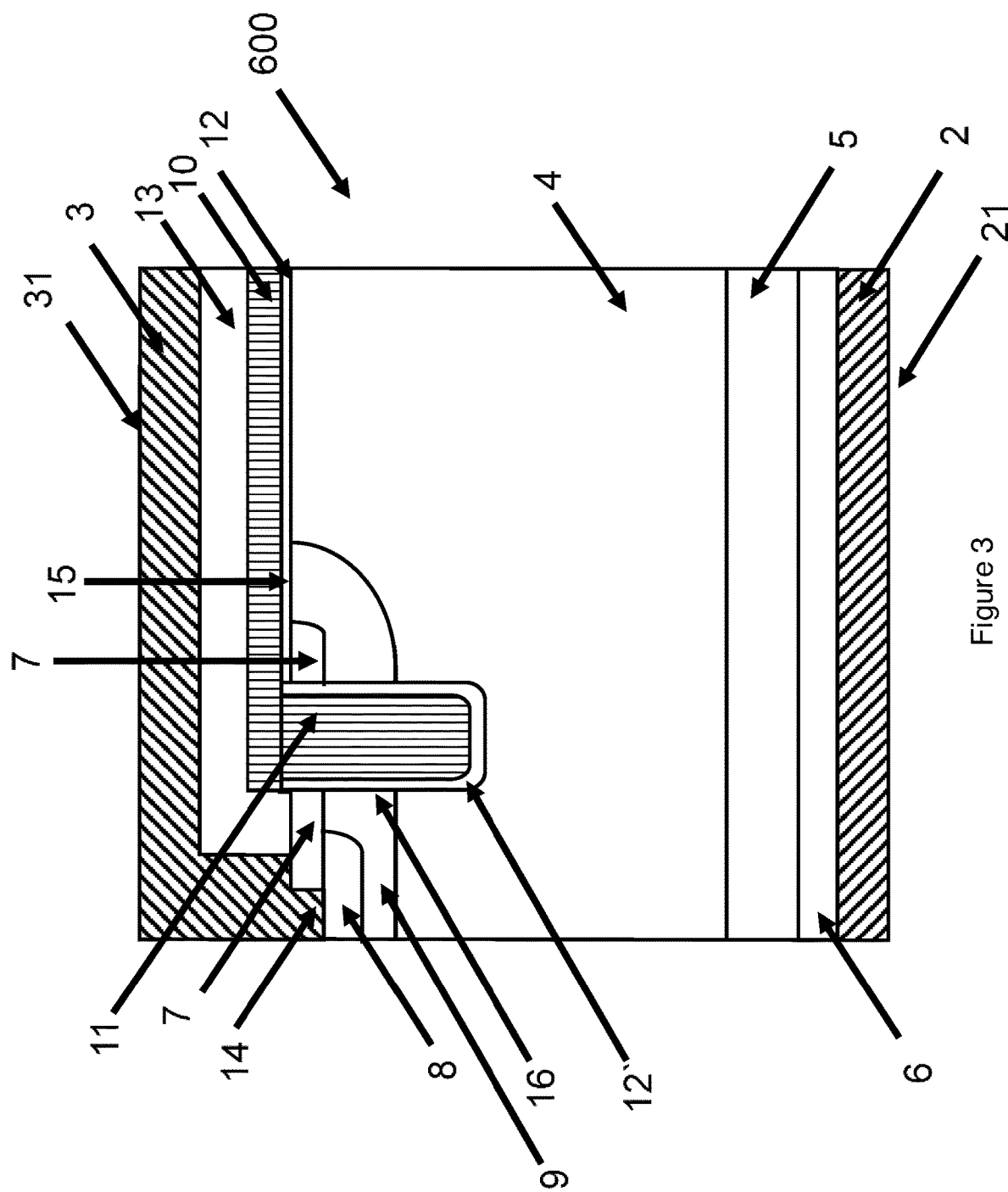
FIG. 3: show the cross section of Trench Planar MOS IGBT structure.
Figure 4A:
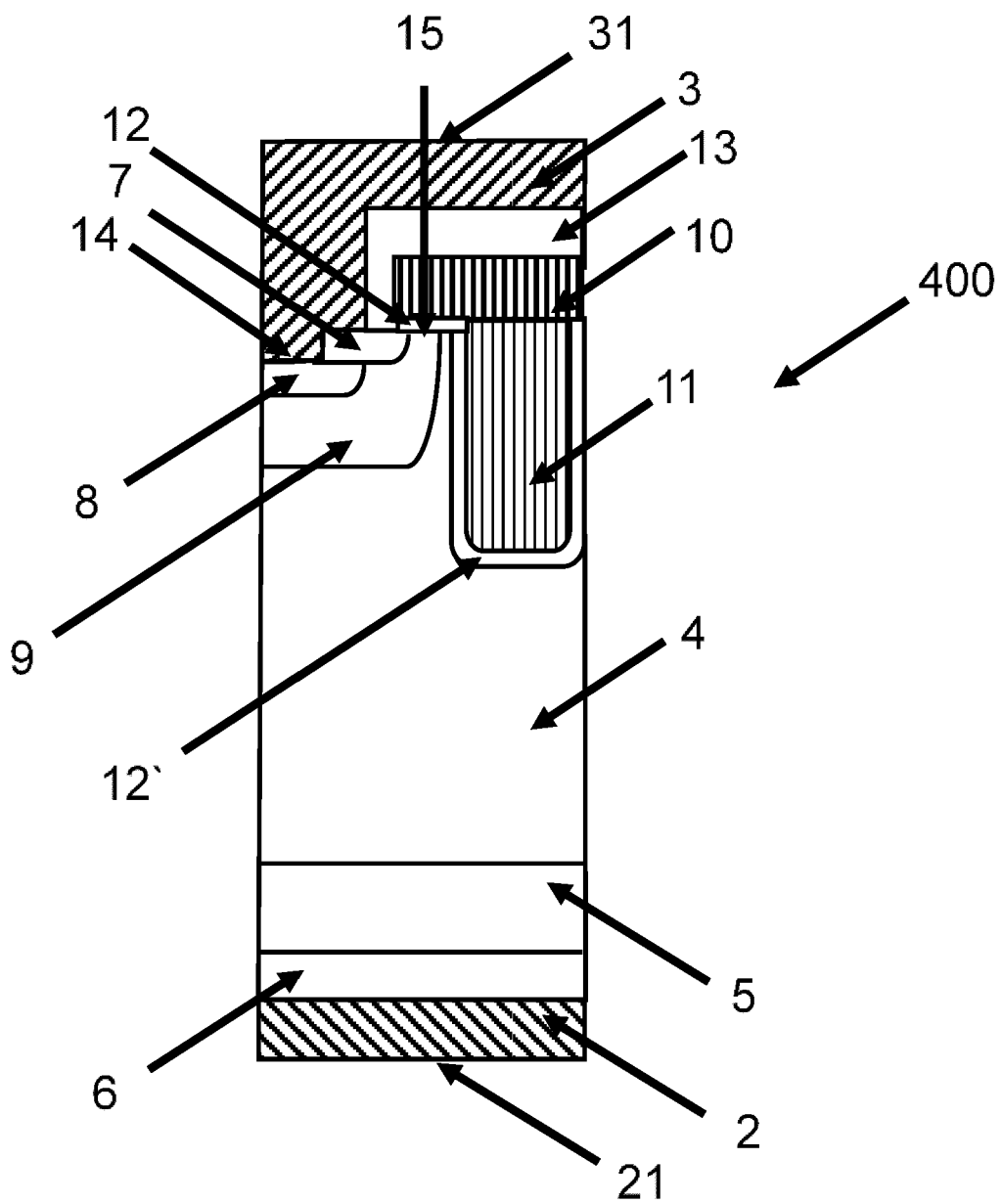
FIG. 4A-B: show an alternative cross-section of Trench Planar MOS IGBT structures, in particular structures with Gaussian p well profiles.
Figure 4B:
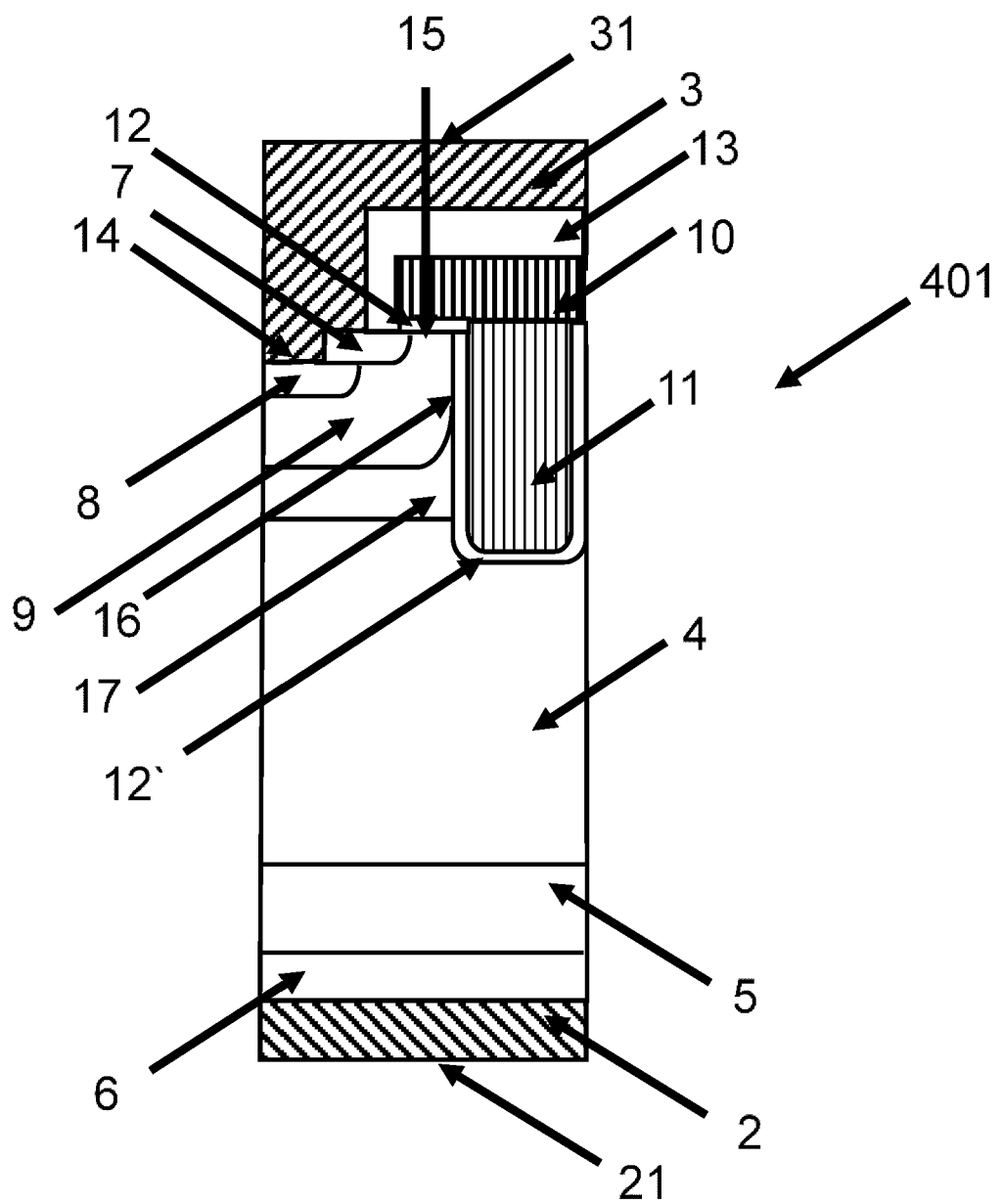
Figure 5:
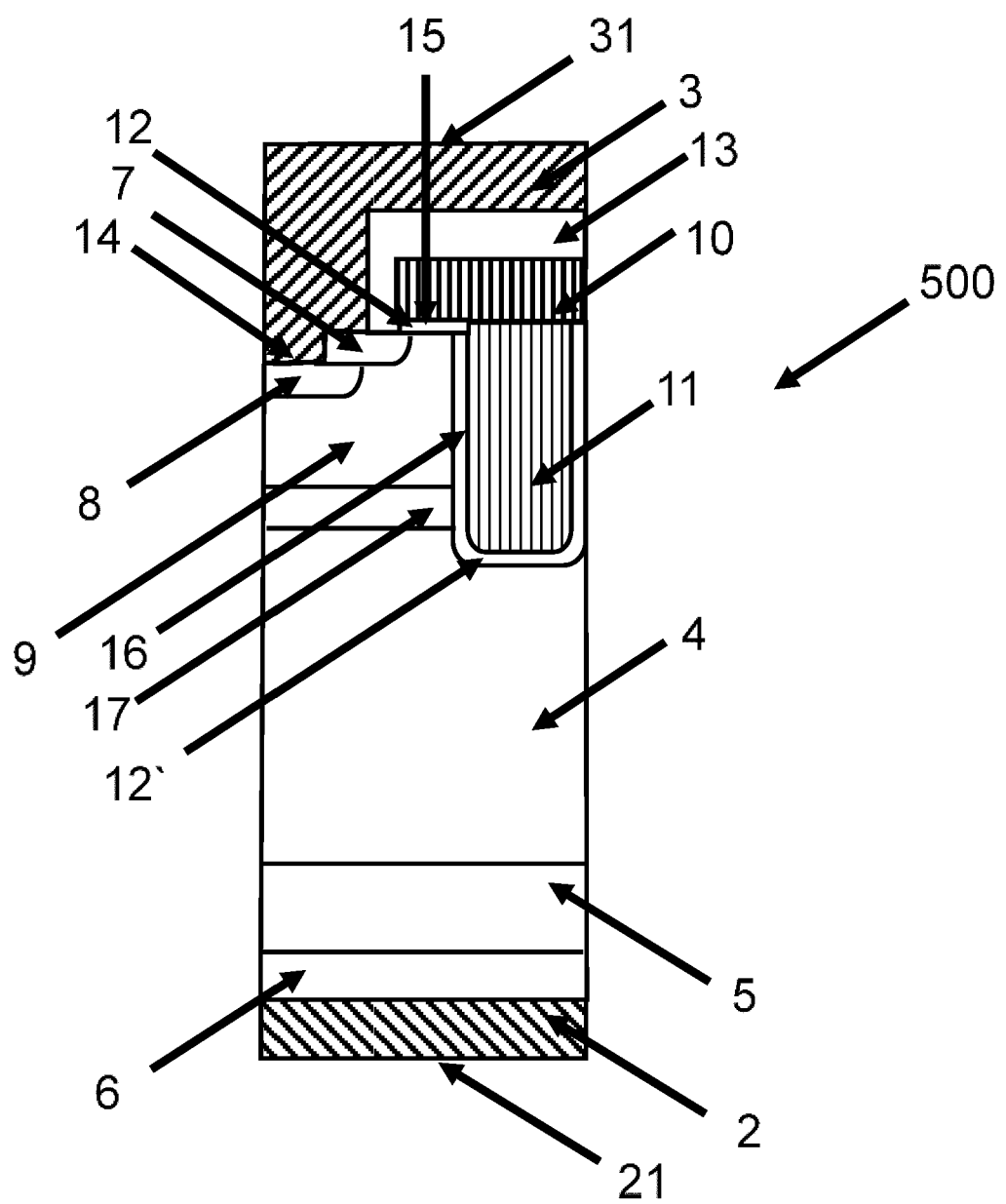
FIG. 5: show the cross sections of Planar Trench MOS IGBT structure.
Figure 6:
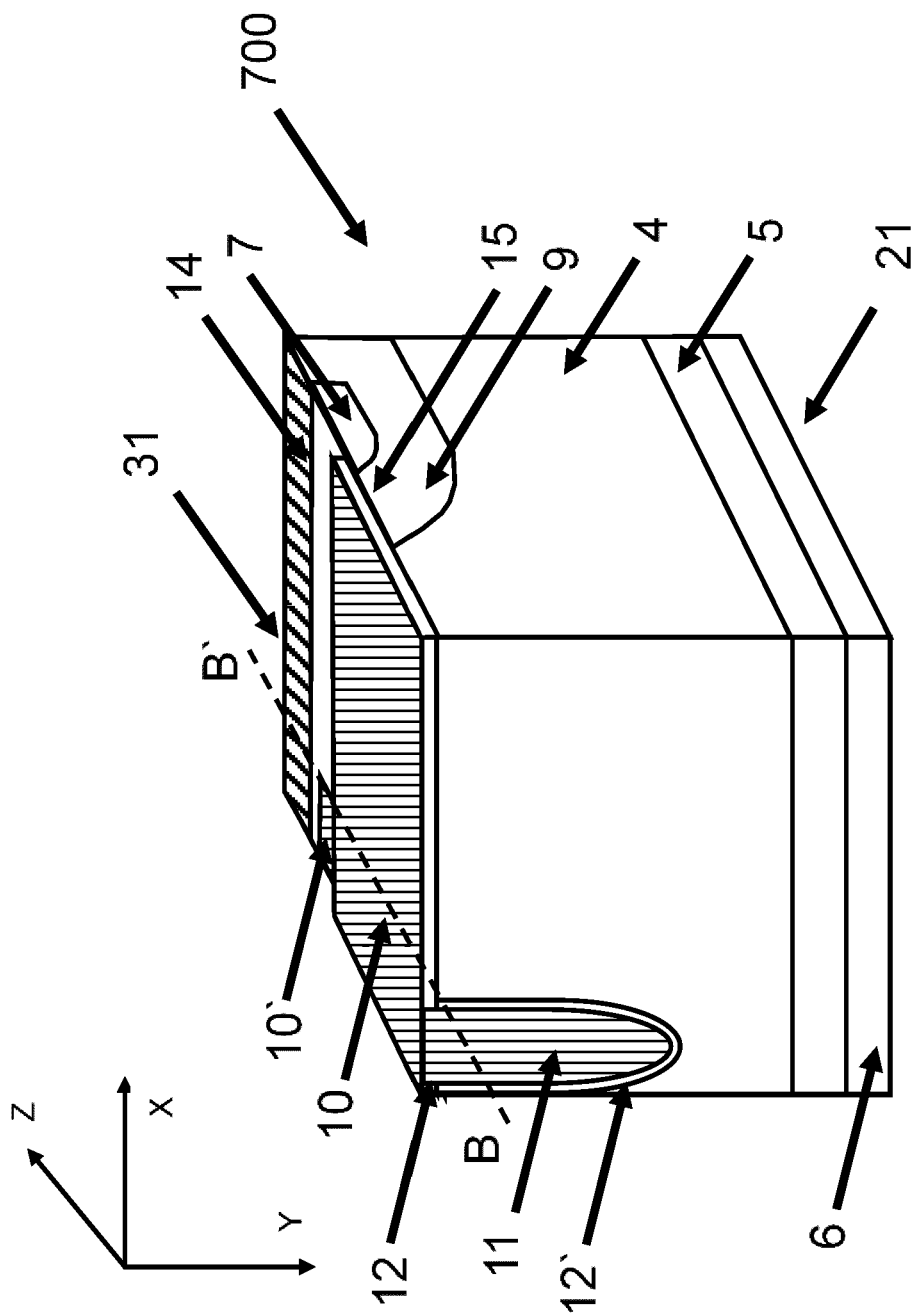
FIG. 6: show three dimensional illustrations of the Trench Planar MOS IGBT structure with a planar channel orthogonal to the trench region.
Figure 7:
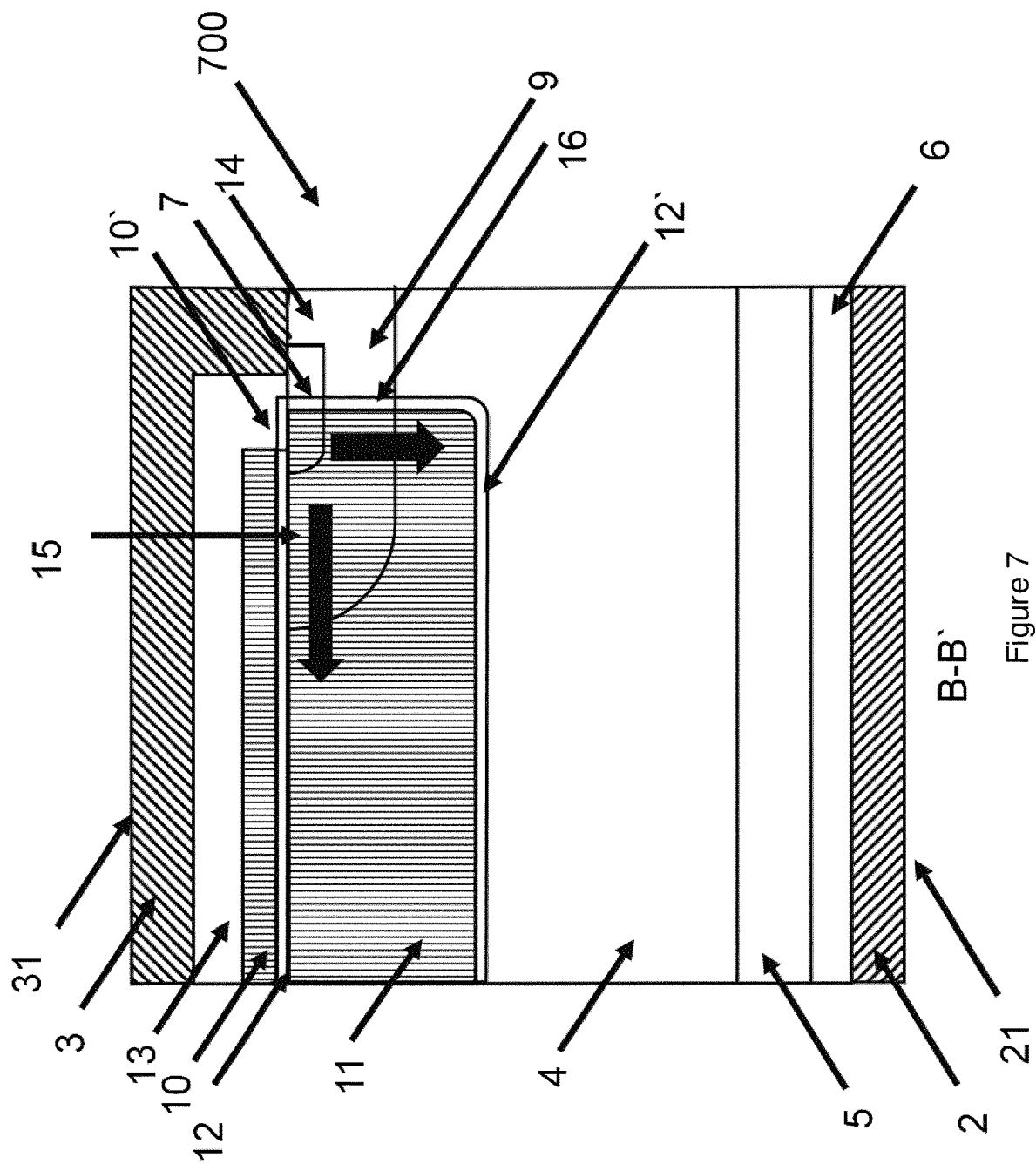
FIG. 7: show the cross sections of FIG. 6 at cut B-B' showing both planar and vertical MOS channels are formed.
Figure 8:
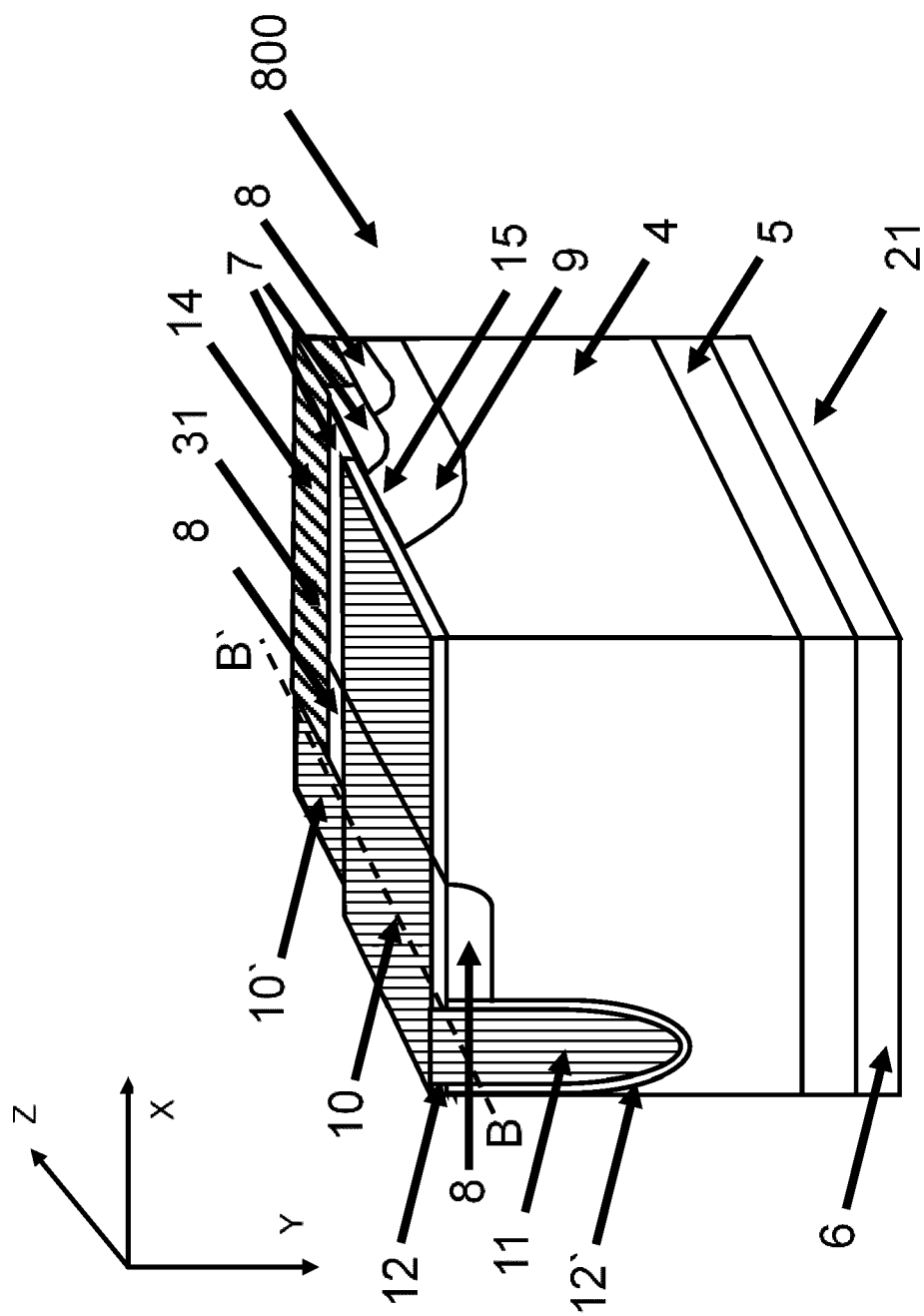
FIG. 8: show three dimensional illustrations of the Trench MOS IGBT structure with a planar channel orthogonal to the trench region.
Figure 9:
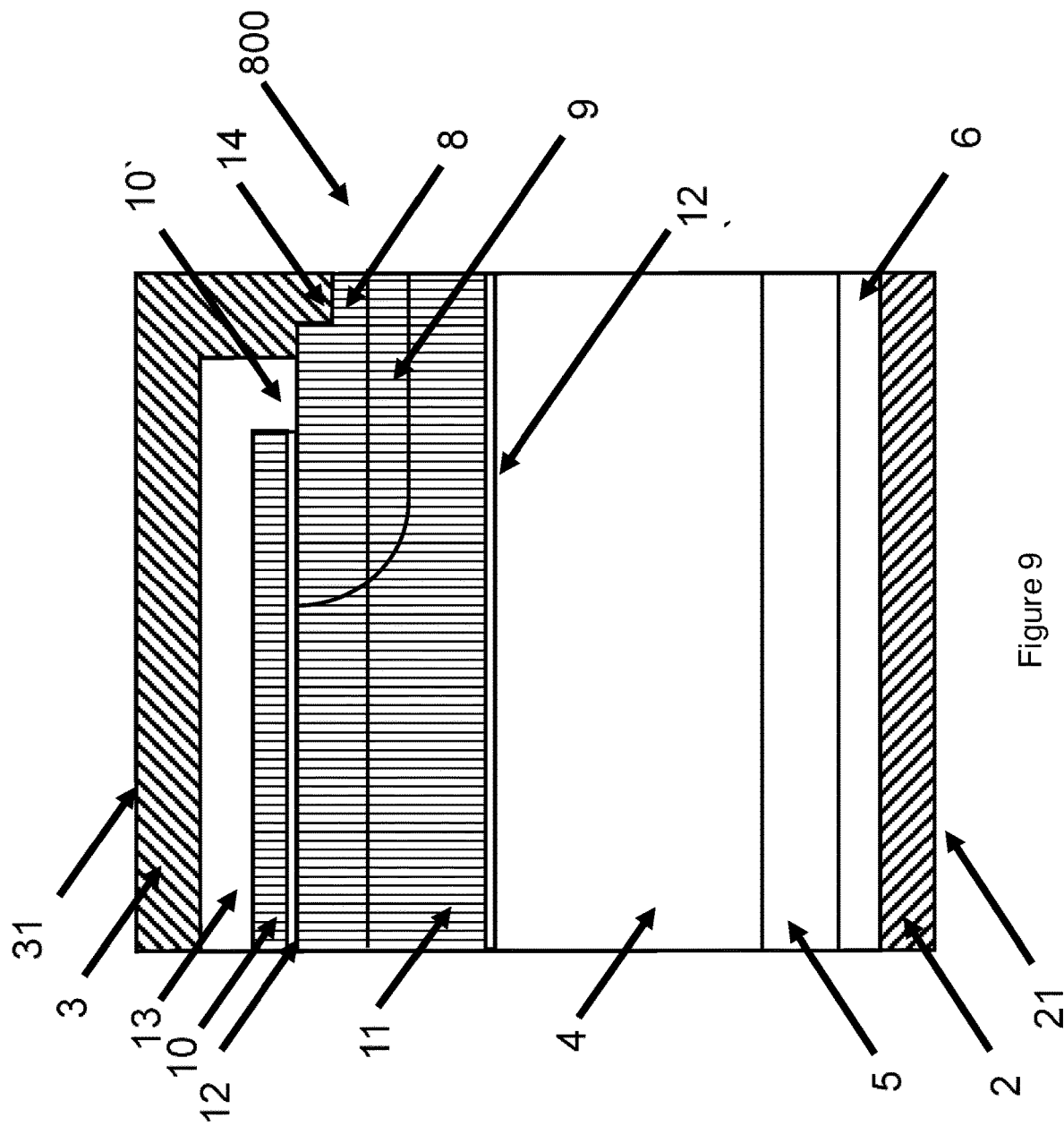
FIG. 9: show the cross sections of FIG. 8 at cut B-B'.
Figure 10:
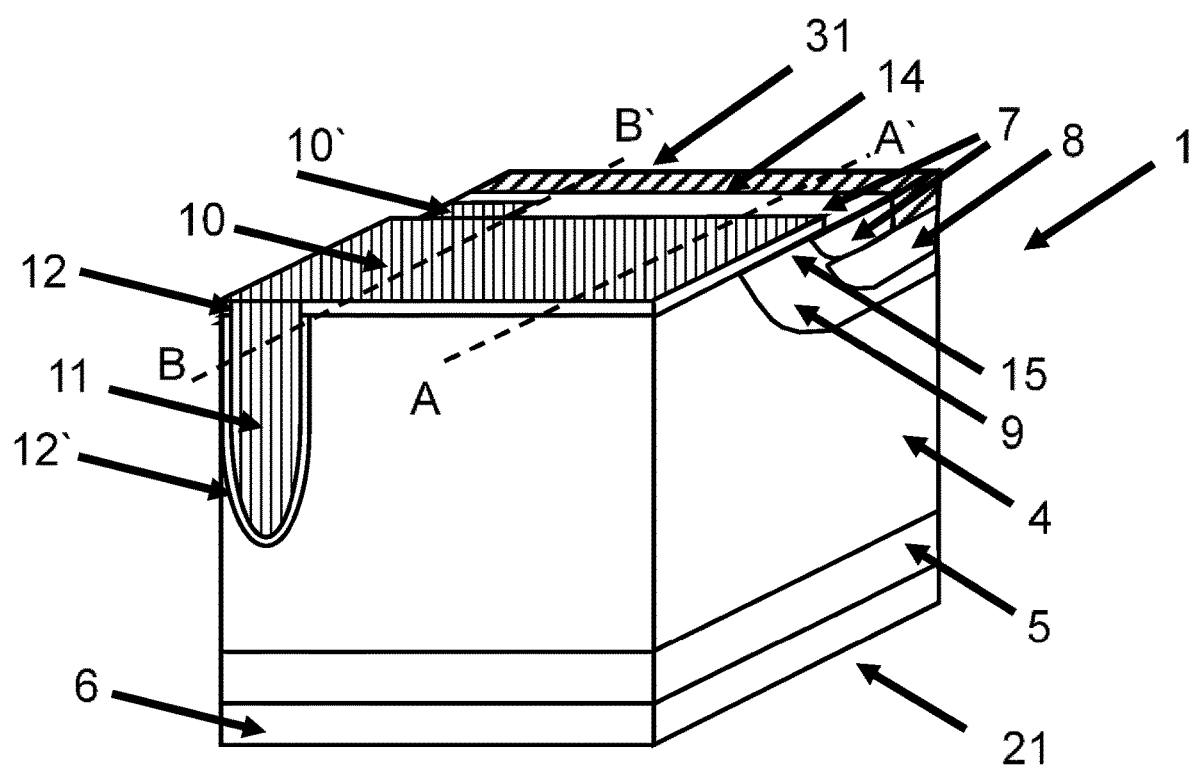
FIG. 10: show a first example embodiment of a power semiconductor device according to the invention
Figure 11:
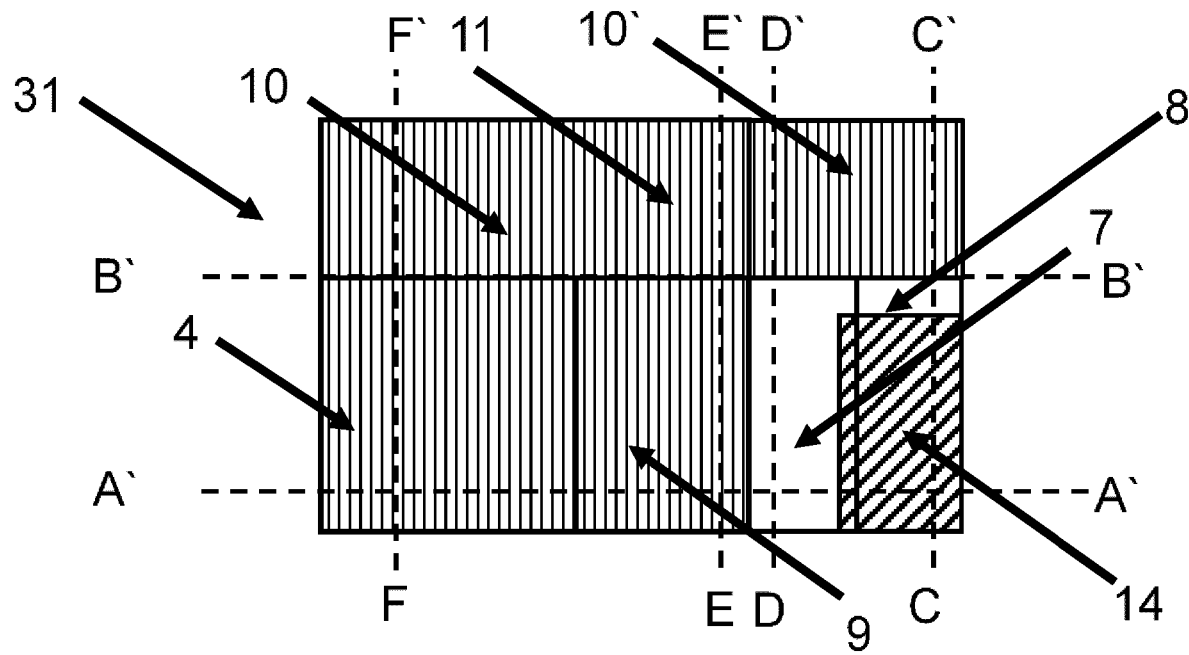
FIG. 11: Top view of the first example embodiment of a punch-through IGBT according to the invention
Figure 12:
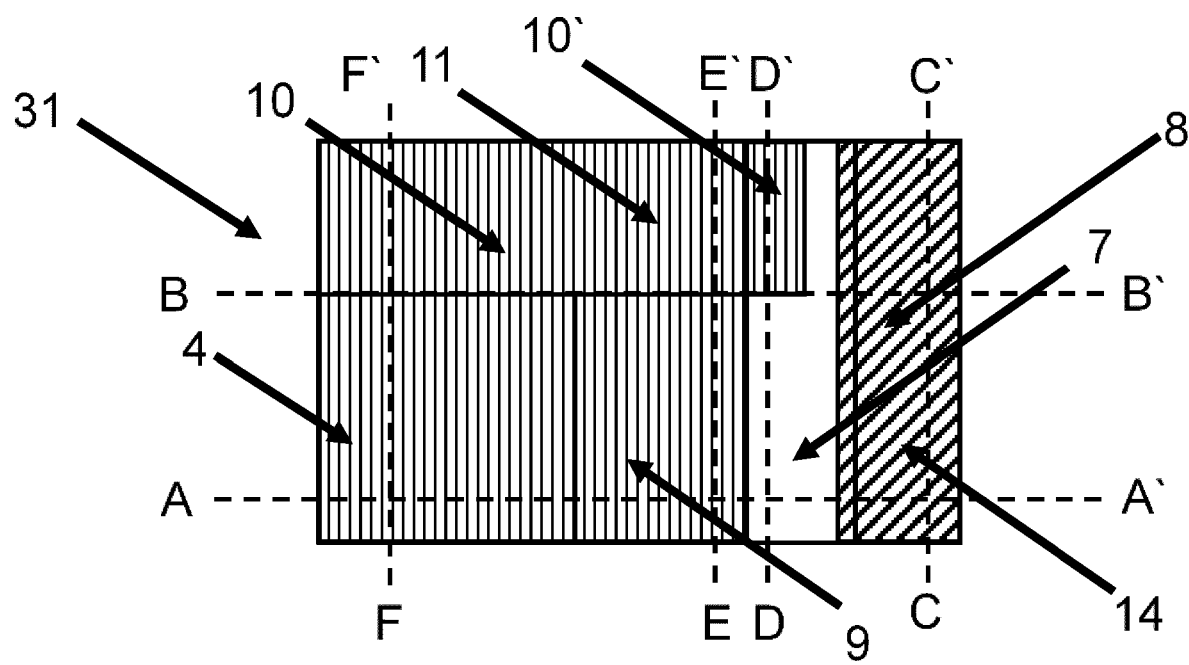
FIG. 12: Top view of a second example embodiment of a punch-through IGBT according to the invention
Figure 13:
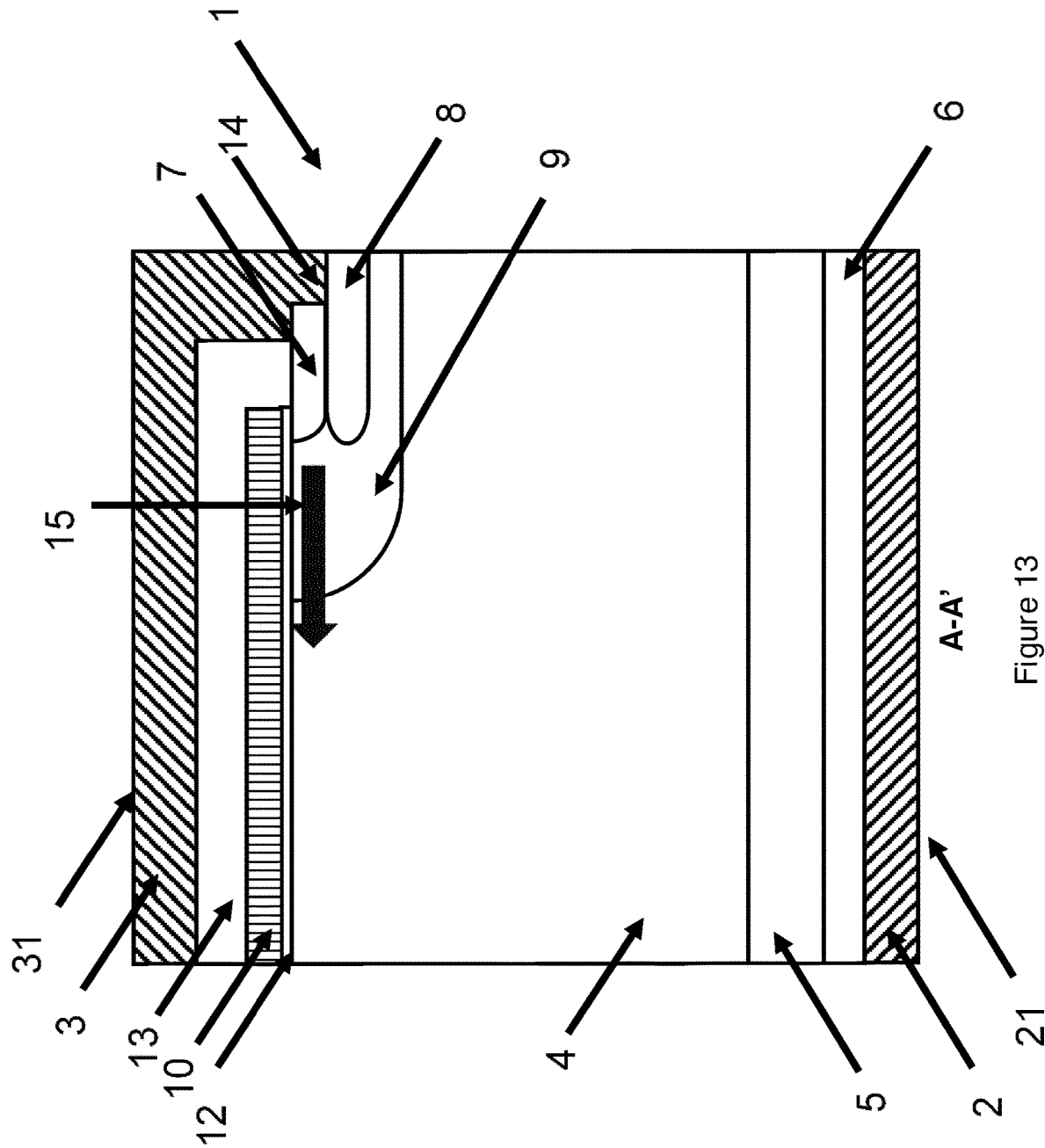
FIG. 13: Cross section of FIG. 10 along A-A' showing the planar MOS channel.
Figure 14:
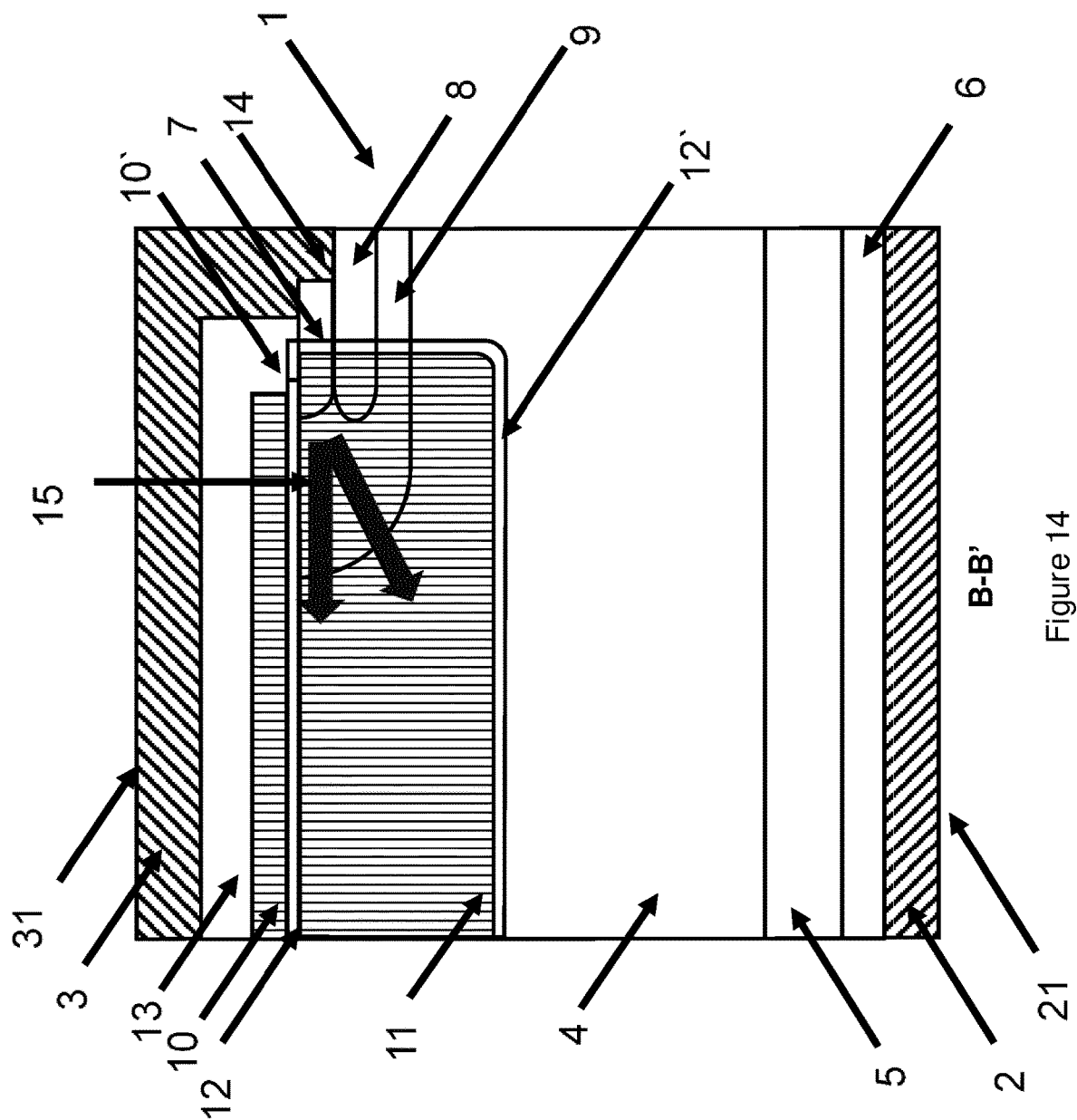
FIG. 14: Cross section of FIG. 10 along B-B' showing that no vertical MOS channel is created.

FIG. 10 shows a first exemplary embodiment of a power semiconductor device 1 in form of a punch through insulated gate bipolar transistor (IGBT) with a four-layer structure (pnpn). The layers are arranged between an emitter electrode 3 on an emitter side 31 and a collector electrode 2 on a collector side 21, which is arranged opposite of the emitter side 31. The IGBT comprises the following layers:

an (n-) doped drift layer 4, which is arranged between the emitter side 31 and the collector side 21, a p doped first base layer 9, which is arranged between the drift layer 4 and the emitter electrode 3, a p doped second base layer 8, which is arranged between the first base layer 9 and the emitter electrode 3, which second base layer 8 is in direct electrical contact to the emitter electrode 3, which second base layer 8 has a higher doping concentration than the first base layer 9, which second base layer 8 extends perpendicularly deeper than the source region and laterally to the same distance/extent as the source region. Therefore, preventing a vertical channel from forming in the trench regions while allowing the horizontal channels to form, an n doped source region 7, which is arranged at the emitter side 31 embedded into the first base layer 9 and contacts the emitter electrode 3, which source region 7 has a higher doping concentration than the drift layer 4, a first gate electrode 10, which is arranged on top of the emitter side 31 and the first gate electrode 10 is electrically insulated from the first base layer 9, the source region 7 and the drift layer 4 by a first insulating layer 12, an horizontal channel 15 is formable between the emitter electrode 31, the source region 7, the first base layer 9 and the drift layer 4, a plurality of second gate electrodes 11, each of which is electrically insulated from the first base layer 9, the second base layer 8, the source region 7 and the drift layer 4 by a second insulating layer 12' and which second gate electrode 11 is arranged orthogonally to the plane of the first base layer 9, the second base layer 8, and source region 7 and extends deeper into the drift layer 4 than the first base layer 9, a vertical channel is not formable between the emitter electrode 3, the source region 7, the second base layer 8, the first base layer 9 and the drift layer 4, a collector layer 6 arranged between the buffer layer 5 and the collector electrode 2, which the collector layer 6 is in direct electrical contact to the collector electrode 2, a buffer layer 5 arranged between the collector layer 6 and the drift region 4, The trench regions can be better viewed in the top cell views shown in FIG. 11 and FIG. 12 for the two main embodiments of the inventive design with a discontinued trench and a continuous trench cutting through the planar cell. The inventive design consists of a basic planar MOS cell design with active trenches 11 (connected to gate electrode 10) occupying the regions between the planar cells in the Z dimension or in other words orthogonal to the X dimension (which represents also the longitudinal extension direction of the planar cells). FIG. 13 to FIG. 15 show the cross sections of the inventive design along the cut lines shown in FIG. 11. The inventive design provides a lateral channel 15 in the planar regions 10 and lateral channel 15 a with improved vertical spreading in the trench region 11.

Specifically, the trench extends vertically to a depth approximately in a range from about 2 μm to about 7 μm. The trench width may range from about 3 μm to about 0.5 μm.

Figure 16:
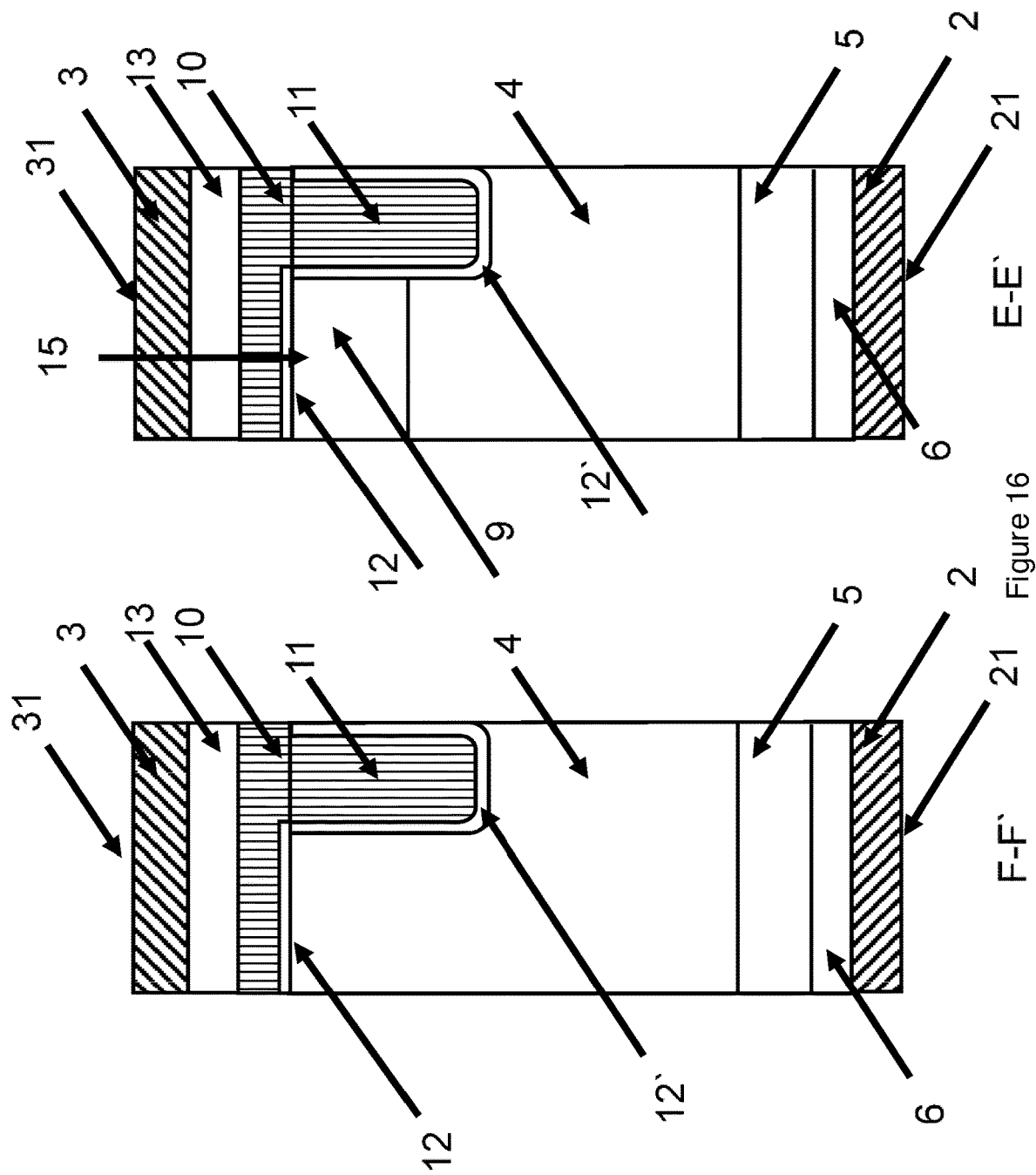
FIG. 16: Cross section of FIG. 11 along E-E' and F-F.
Figure 17:
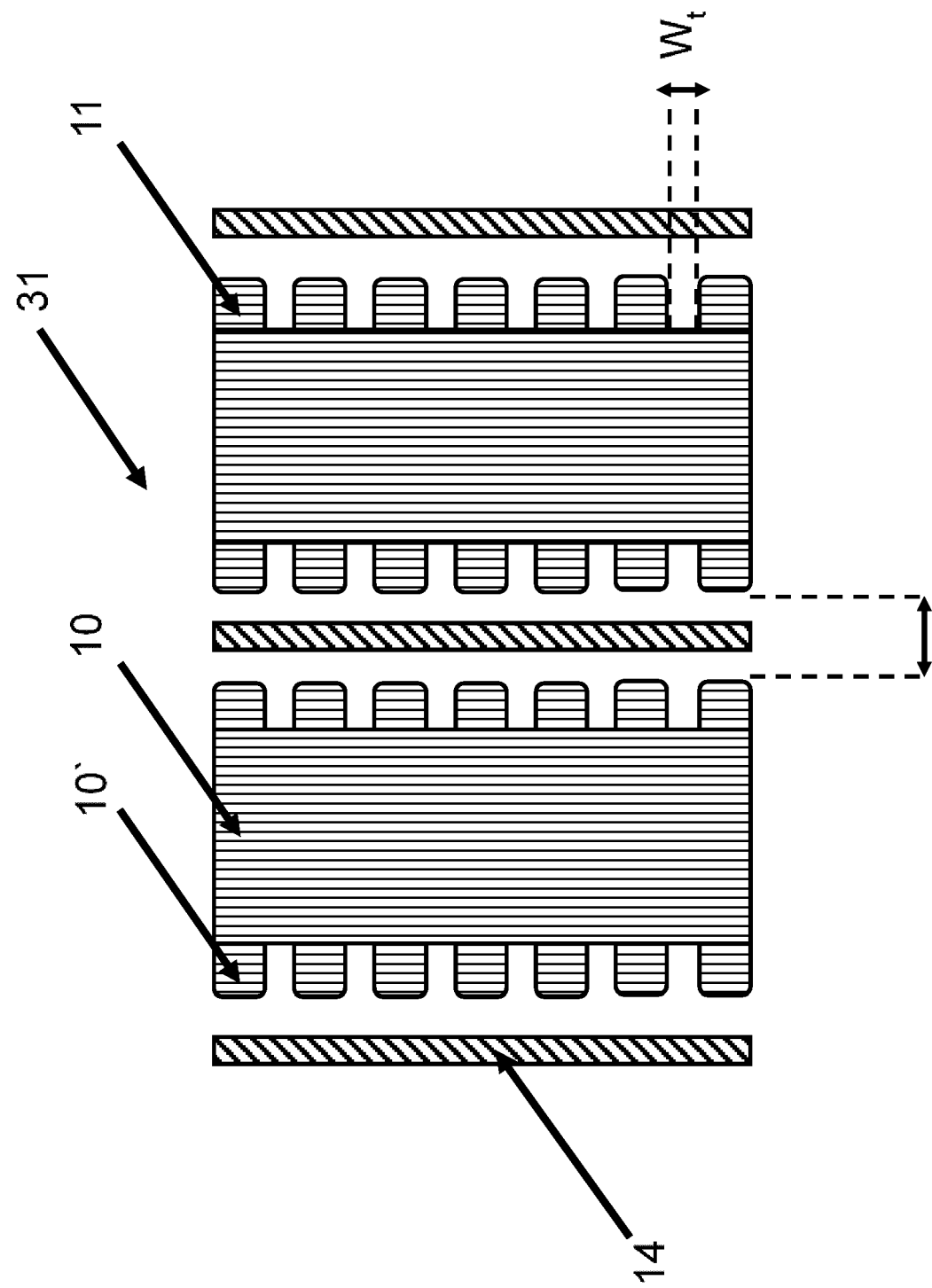
FIG. 17: An example top view for a stripe design of first example embodiment of a punch-through IGBT according to the invention

With respect to the Cartesian coordinate system shown in FIG. 16, the critical design aspects are the dimension $W_t$ or mesa between the orthogonal trenches, as well as the dimension $W_p$ representing the distance from the end of one trench to the adjacent trench along the planar channel. Improved carrier storage/reduced hole drainage is expected as the dimension $W_t$ and $W_p$ are reduced. The value of $W_t$ may be in a range from about 5 μm to below 0.1 μm, more preferably from 1 μm to 0.1 μm-which is achievable with the proposed design because no additional structures have to be lithographically defined in between the trenches, as in prior art. Also, improved carrier storage/reduced hole drainage is expected with reducing the planar cell dimensions, or by keeping the same pitch for the planar cell part, but reducing the distance $W_p$ by etching the adjacent trenches closer to each other in the X direction. More specifically, $W_p$ could extend approximately in a range from about 20 μm to about 1 μm, preferably from 5 μm to 1 μm, and more preferably from 2 μm to 1 μm.

The inventive method for manufacturing a planar MOS cell on an emitter side is shown in cross sections in the FIGS. 18 to 28 and top view in the FIGS. 29 to 36. The method comprises manufacturing steps as follows.

Figure 19:
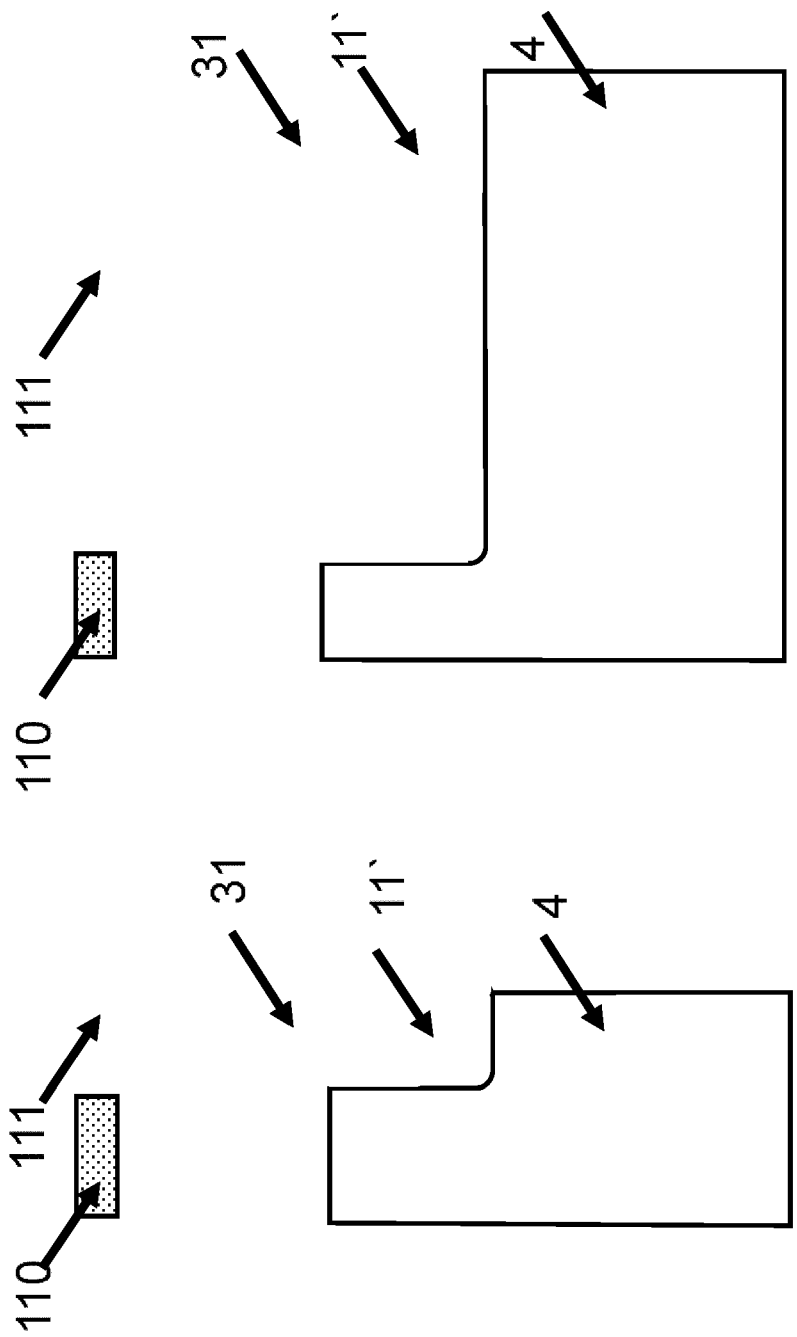
Figure 20:
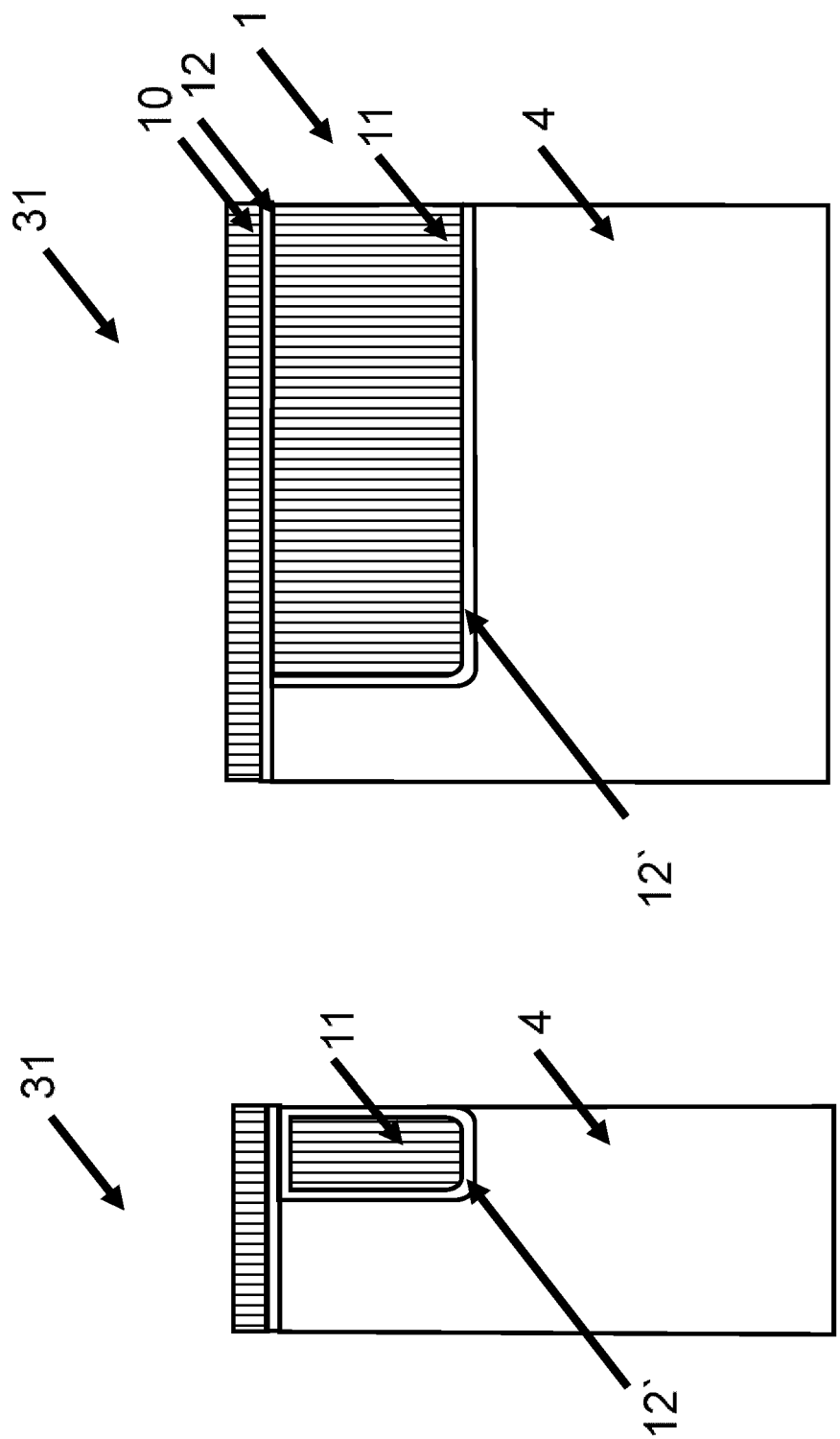

As shown in FIG. 18 (top view FIG. 29) the method is started with a lightly n doped substrate 4, which has an emitter side 31. As shown in FIG. 19 (top view FIG. 30), a trench region 11' is produced by dry etching through a mask opening 111 into the substrate 4. A first oxide layer 12 and second oxide layer 12' are produced completely covering the substrate 4 on the emitter side 31. As shown in FIG. 20 (top view FIG. 31) an electrically conductive layers 10 and 11 are produced on top of the first oxide layer 12 and second oxide layer 12' respectively. The electrically conductive layers 10 and 11 cover the first oxide layer 12 and second oxide layer 12' completely. According to FIG. 21 (top view FIG. 32) an opening 101 in form of a through hole is etched in the electrically conductive layer 10, resulting in a structured gate electrode layer 10, so that part of the first oxide layer 12 is now uncovered 10'.

Afterwards, the first dopants of p conductivity type are implanted into the substrate 4 (shown by arrows 90 in FIG. 22) (top view FIG. 33) using the structured gate electrode layer with its opening as a mask, resulting in a first implant region 9. Afterwards, the implanted first dopants are diffused into the substrate 4. The first dopants are preferably boron ions. The first dopants are preferably implanted with an energy of 20-100 keV and/or a dose of $5 \times 10^{13}/cm^2$ to $2 \times 10^{14}/cm^2$. The first dopants are driven into a maximum depth between 1 μm and 5 μm, in particular between 1 and 3 μm and in particular between 1 and 2 μm. As shown in FIG. 23, the first dopants are not only driven into the substrate 4 in a direction perpendicular to the surface, but they are spread out laterally.

Figure 24:
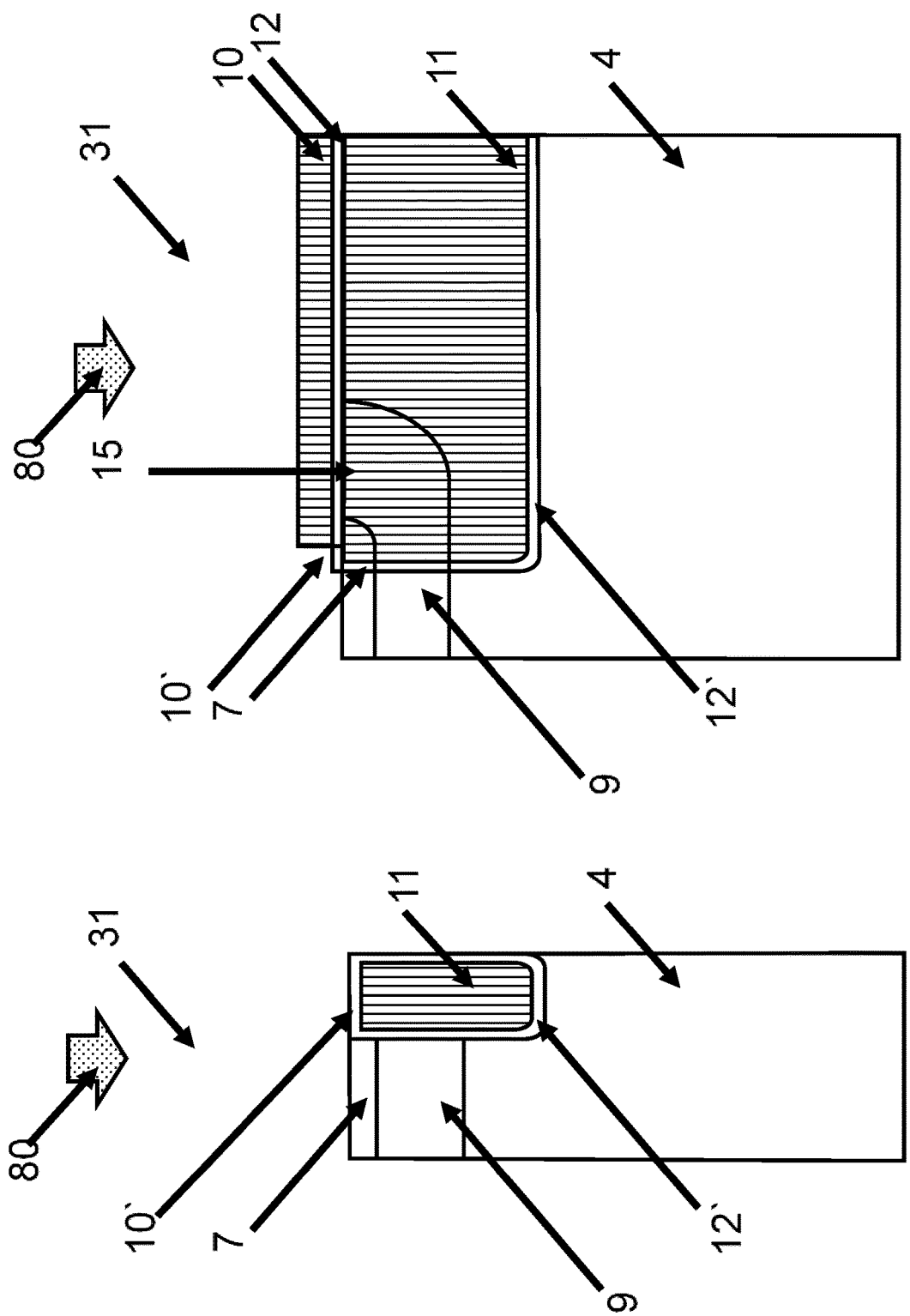

Afterwards, the second dopants of highly doped n conductivity type are implanted into the substrate 4 (shown by arrows 70 in FIG. 23) (top view FIG. 34) using the structured gate electrode layer with its opening as a mask, resulting in a second implant region 7. Afterwards, the implanted second dopants are diffused into the substrate 4. The second dopants are preferably Phosphorous or Arsenic preferably Arsenic ions. The second dopants are preferably implanted with an energy of 100-160 keV and/or a dose of $1 \times 10^{15}/cm^2$ to $1 \times 10^{16}/cm^2$. The second dopants are driven into a maximum depth between 0.5 μm and 1 μm. As shown in FIG. 24, the second dopants are mainly driven into the substrate 4 in a direction perpendicular to the surface, but they are only slightly spread out laterally to form the critical source region under the gate oxide.

Figure 25:
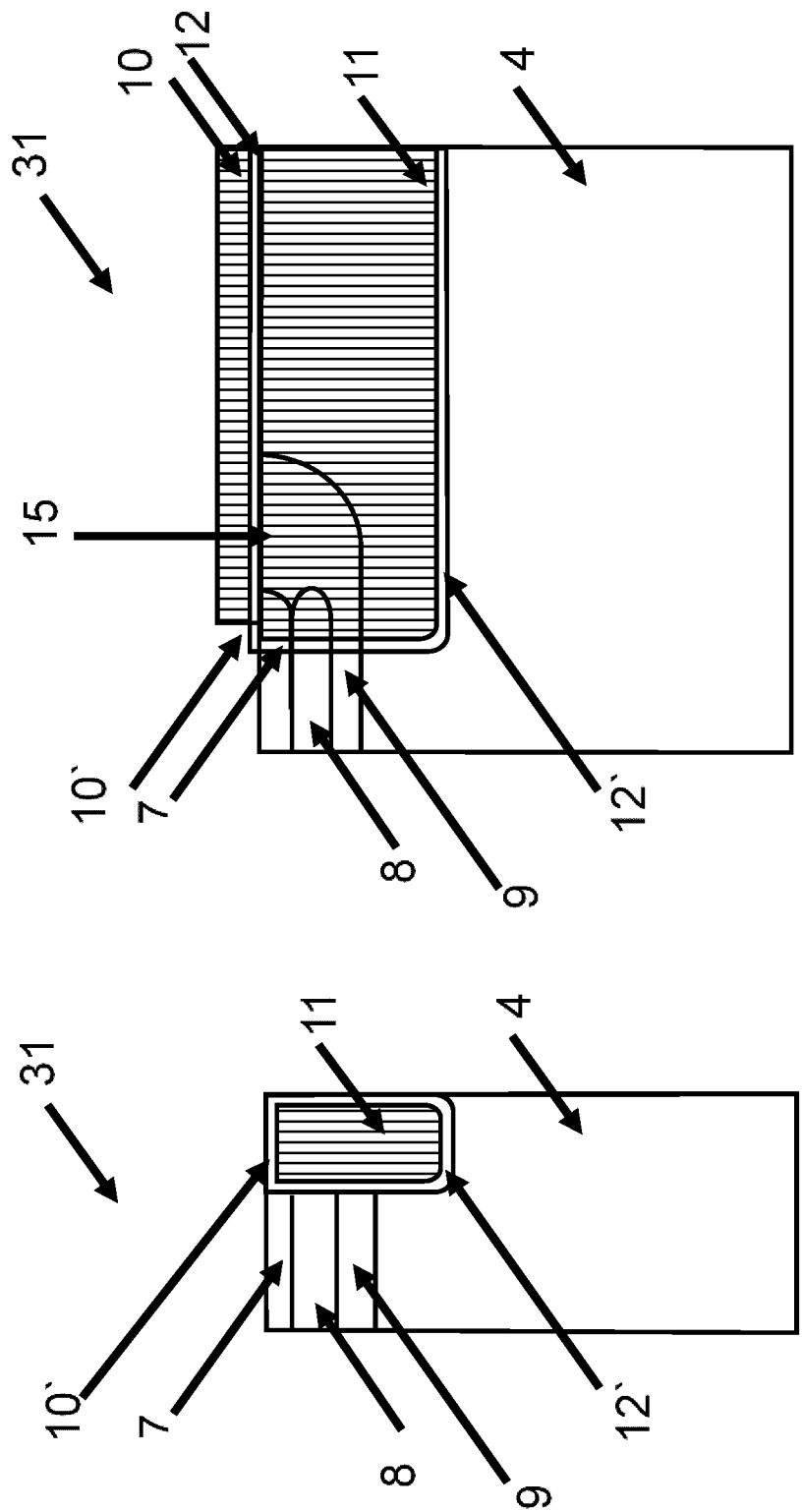

Afterwards, the third dopants of highly doped p conductivity type are implanted into the substrate 4 (shown by arrows 80 in FIG. 24) (top view FIG. 35) using the structured gate electrode layer with its opening as a mask, resulting in a third implant region 8. Afterwards, the implanted third dopants are diffused into the substrate 4. The third dopants are preferably Boron ions. The third dopants are preferably implanted to a higher depth than the second region with an energy of 100-160 keV and/or a dose of $1 \times 10^{15}/cm^2$ to $1 \times 10^{16}/cm^2$. The third dopants are driven into a maximum depth between 0.5 μm and 1.5 μm. As shown in FIG. 25, the third dopants are mainly driven into the substrate 4 in a direction perpendicular to the surface, but they are only slightly spread out laterally to completely cover the lower part of the second region and ensure no vertical trench channel can be formed at the trench regions.

Figure 26:
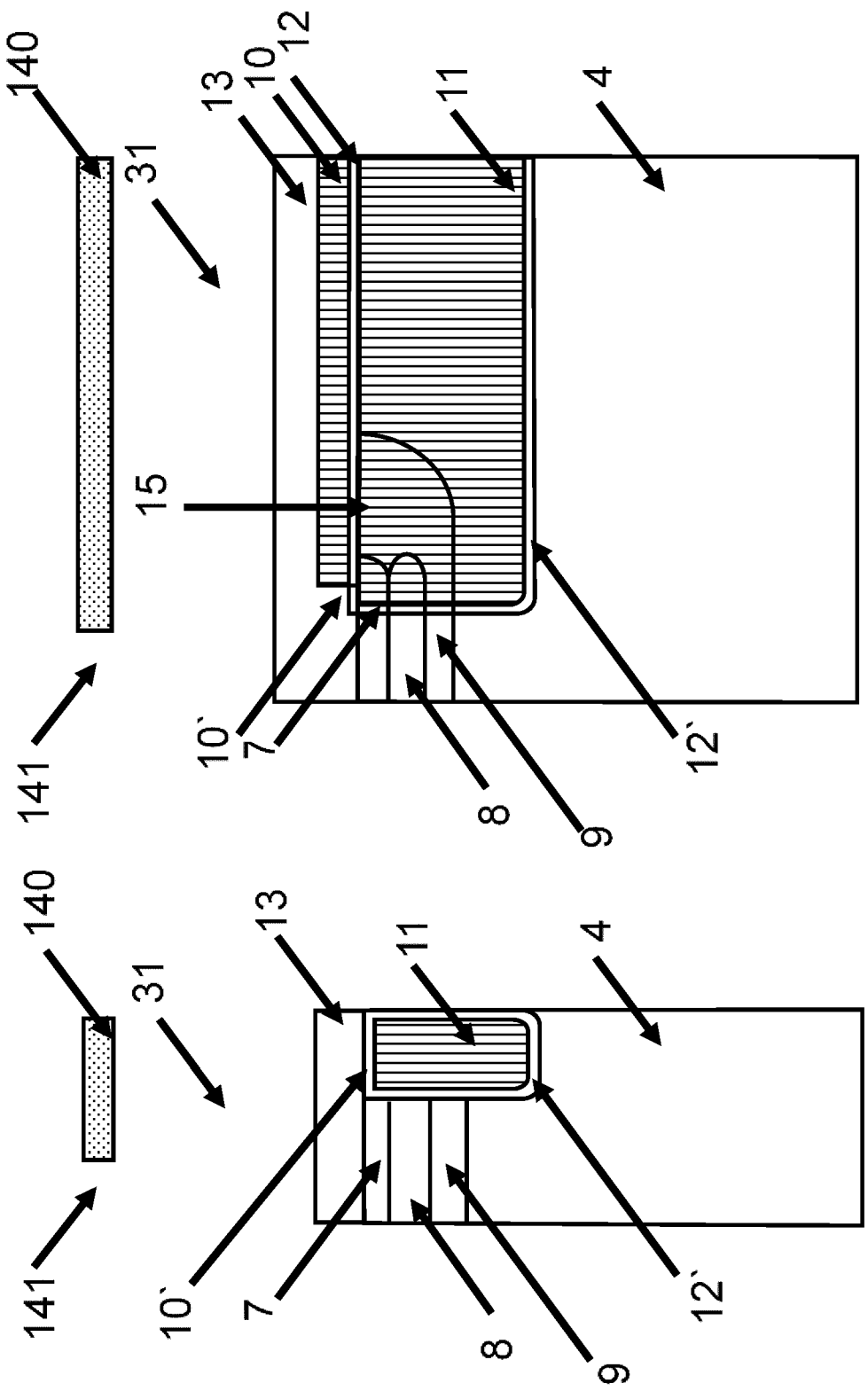
Figure 27:
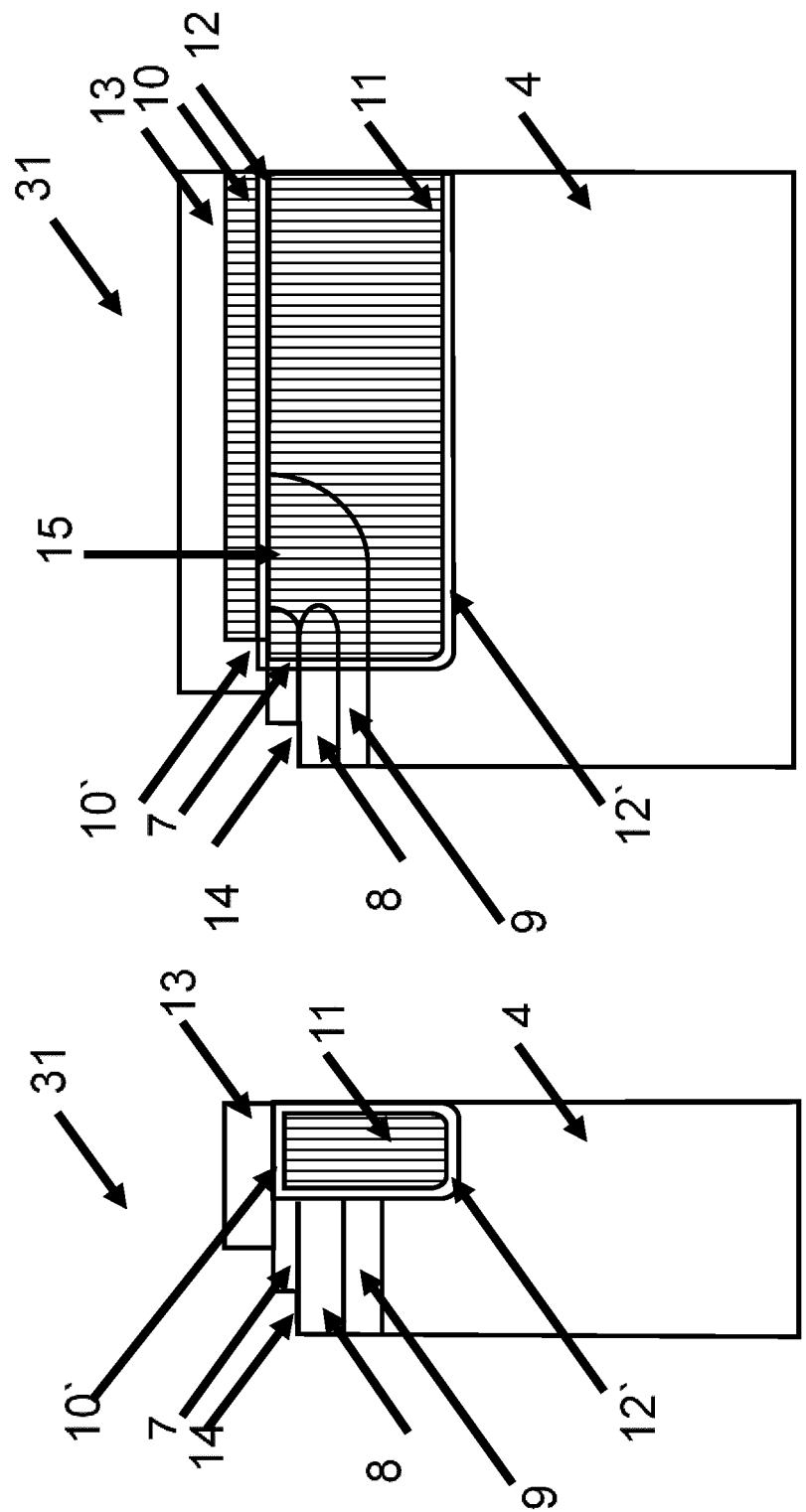
Figure 28:
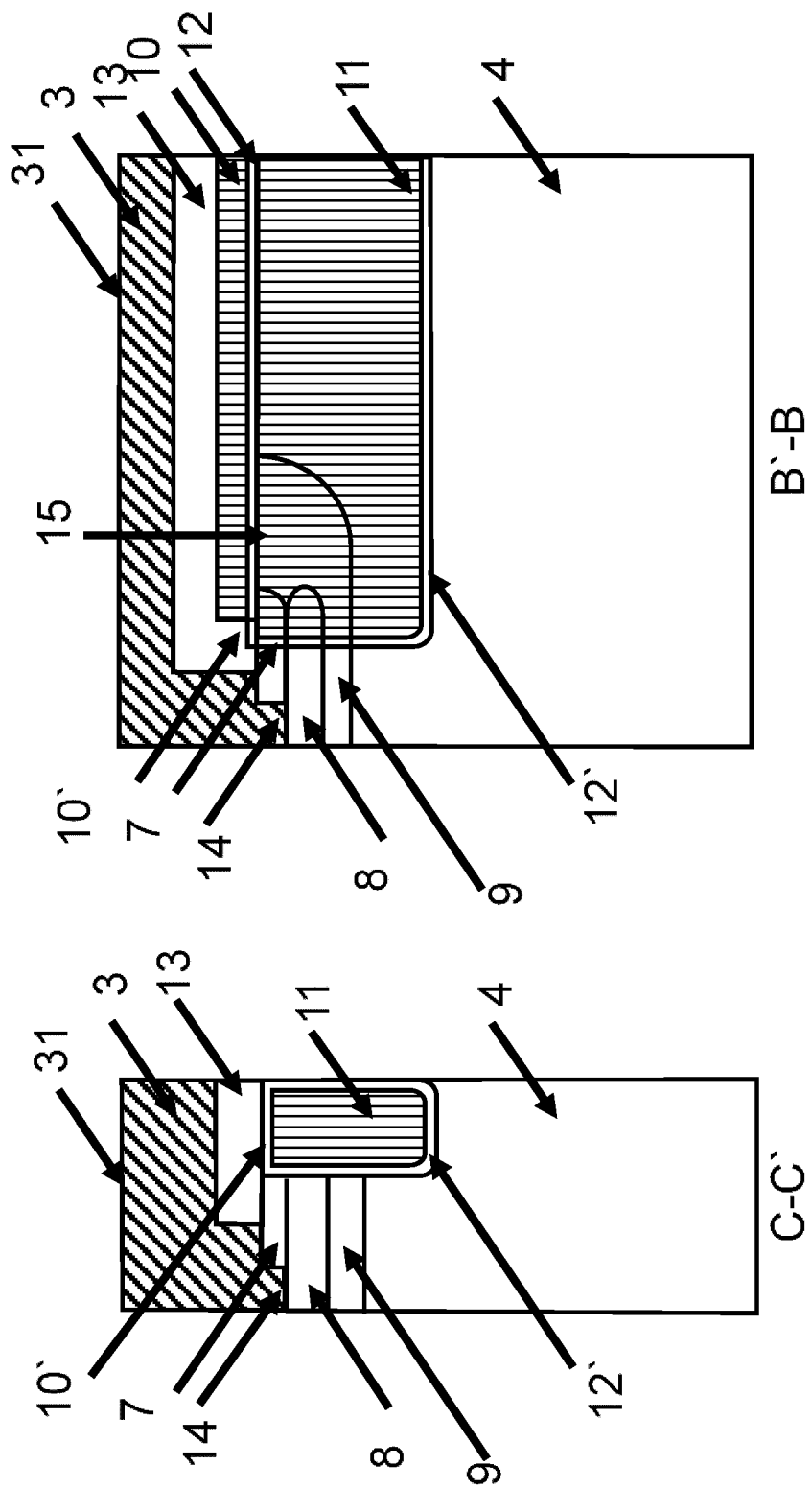
Figure 29:
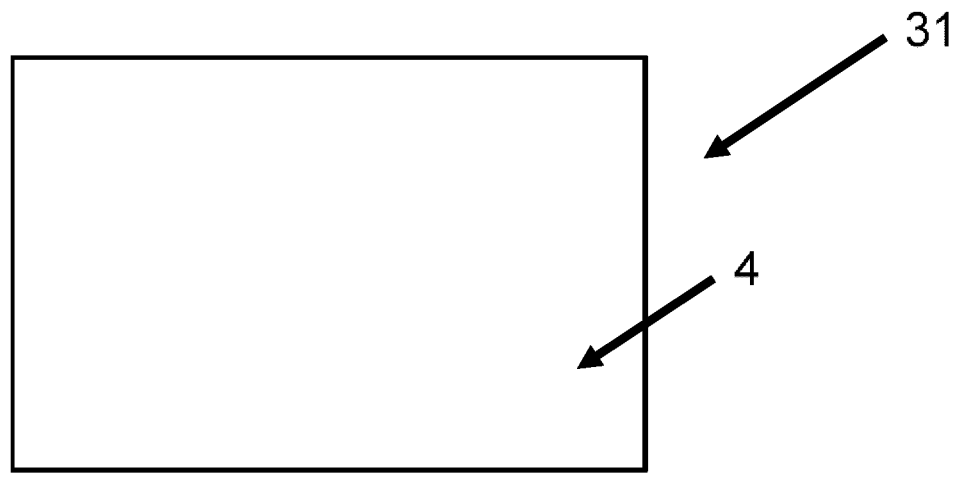
FIGS. 29-36: show a top view of the different steps of the method for manufacturing a semiconductor device according to the invention.
Figure 30:
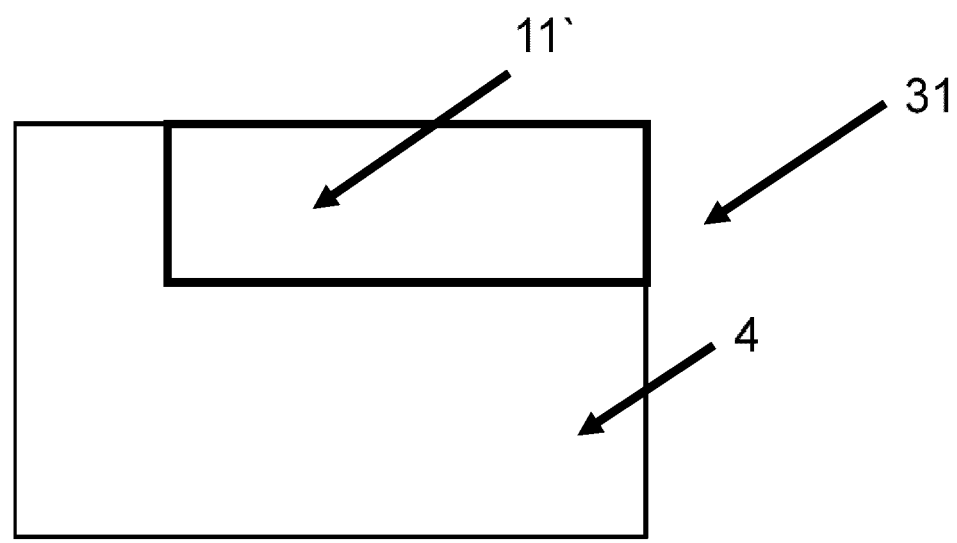
Figure 31:
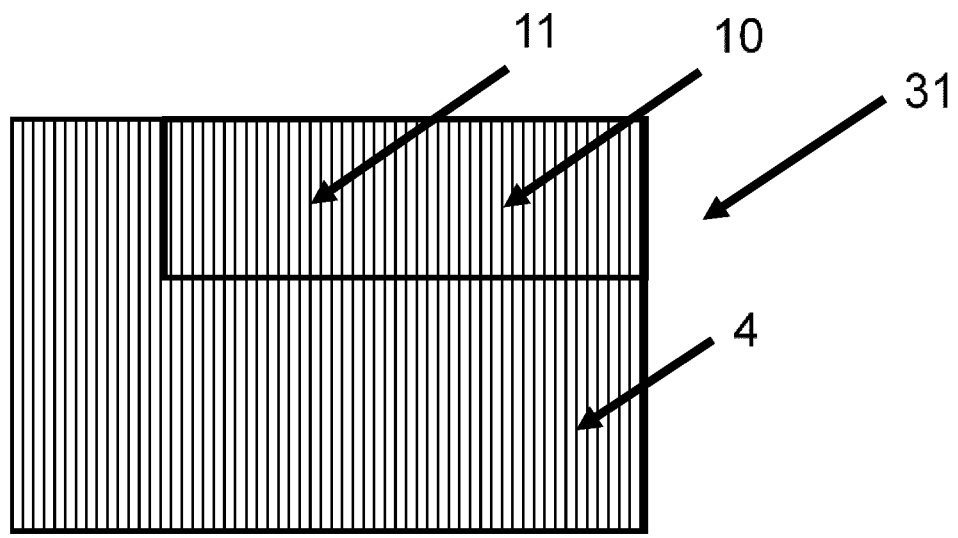
Figure 32:
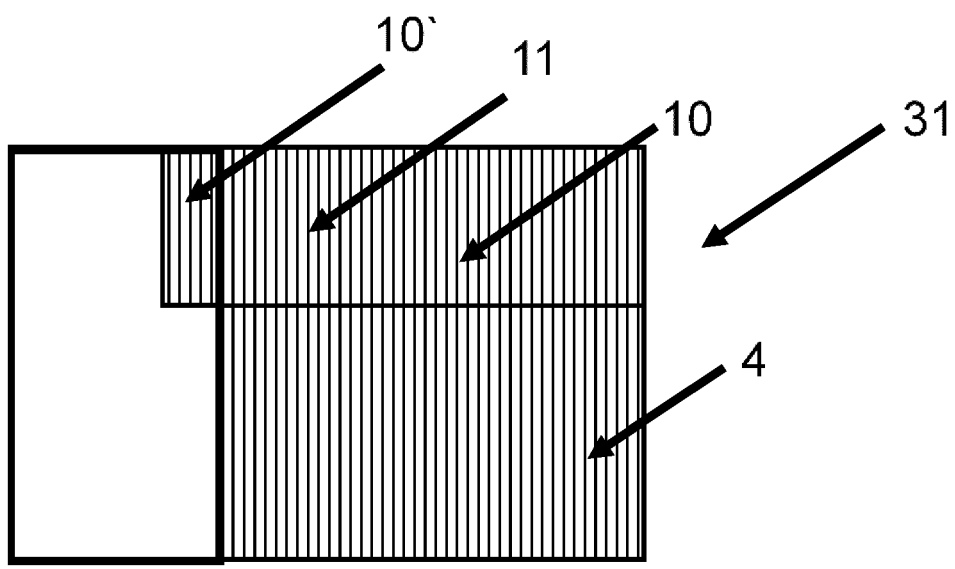
Figure 33:
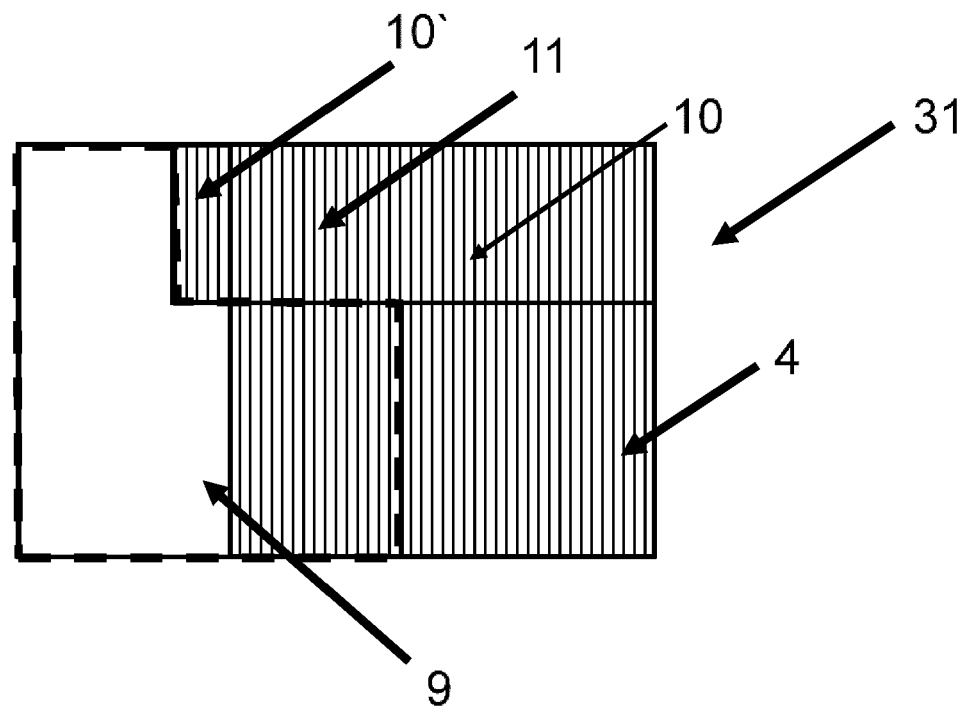
Figure 34:
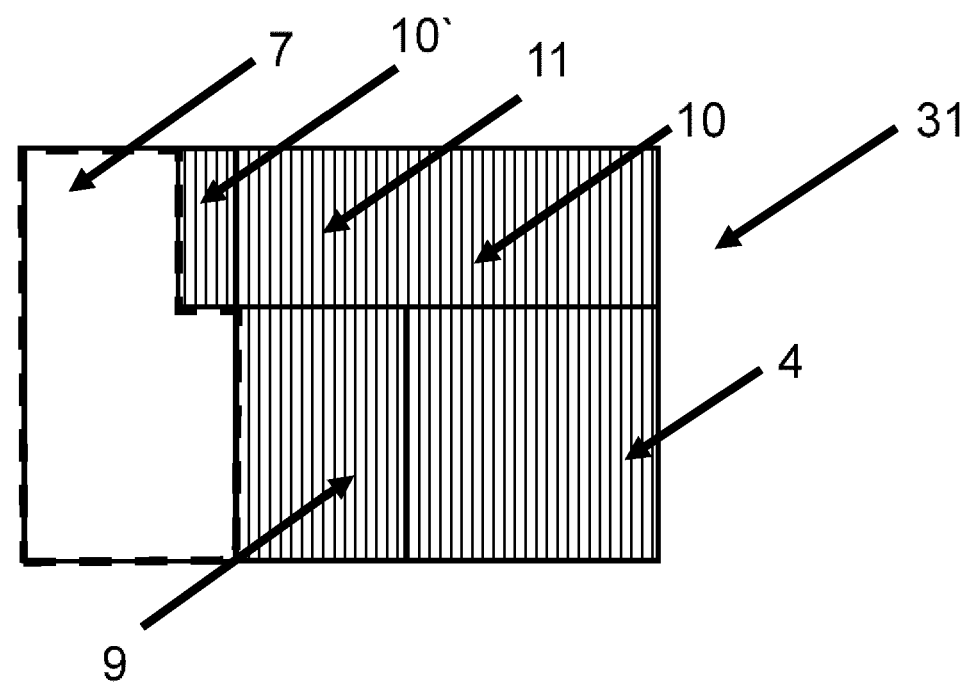
Figure 35:
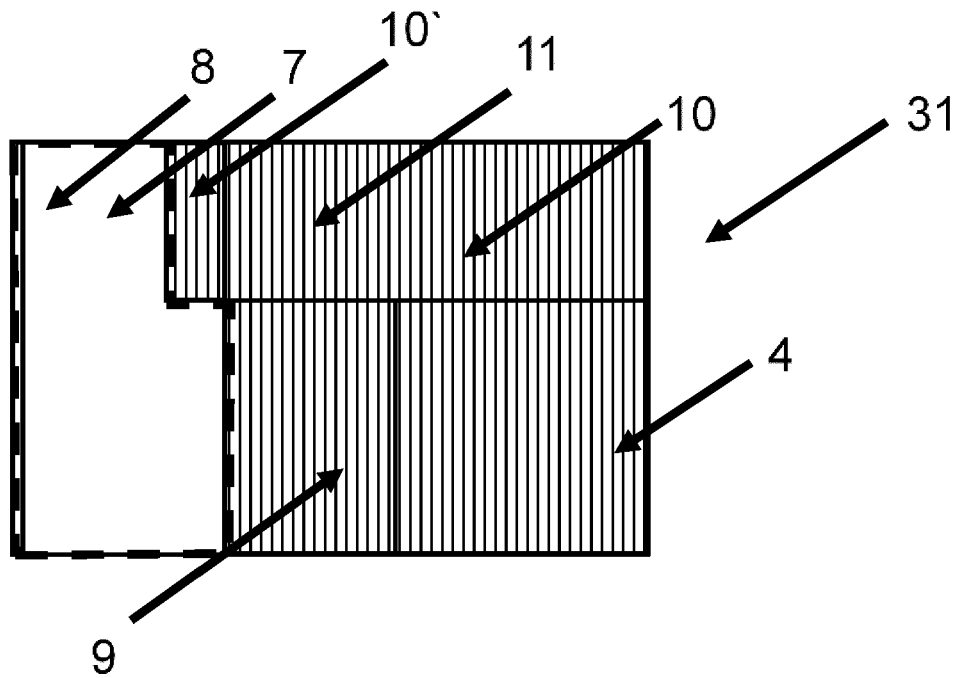
Figure 36:
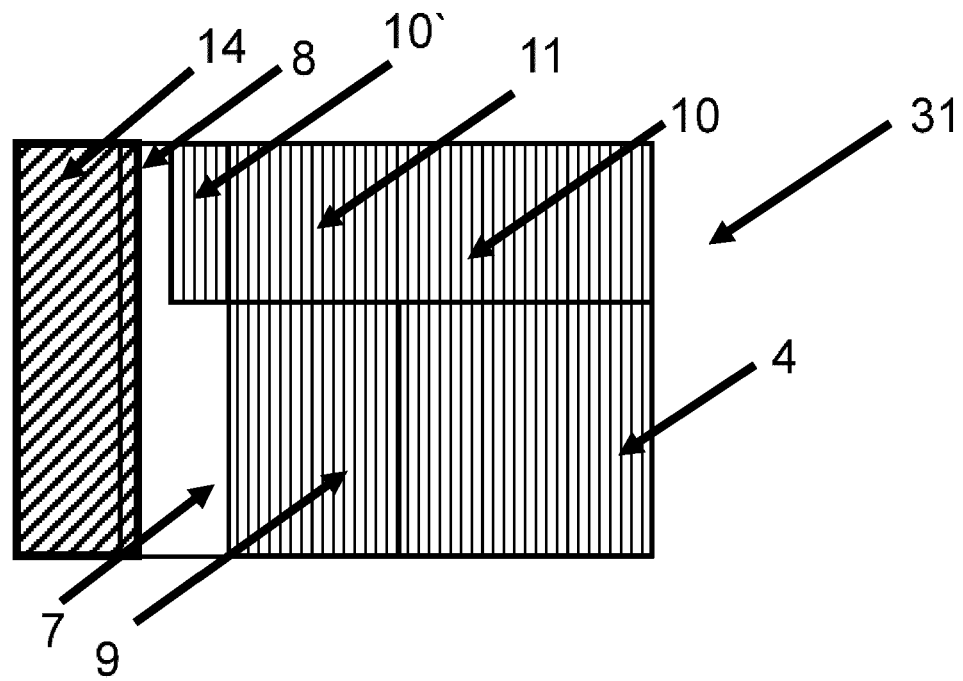

Afterwards, an insulating oxide layer 13 is produced to cover the first main side 31 completely as shown in FIG. 26. The insulating oxide layer thickness can range between 500 nm to 1500 nm. A contact opening 14 is then produced by dry etching fully through a mask opening 141 the insulating oxide layer 13 and the second dopants region 7 layer to reach the third dopants region 8 as shown in FIG. 27 (top view FIG. 36). The contact opening 14 is filled with metal to produce a direct electrical emitter contact 3 to the second dopants region 7 and third dopants region 8 as shown in FIG. 28.

Figure 37:
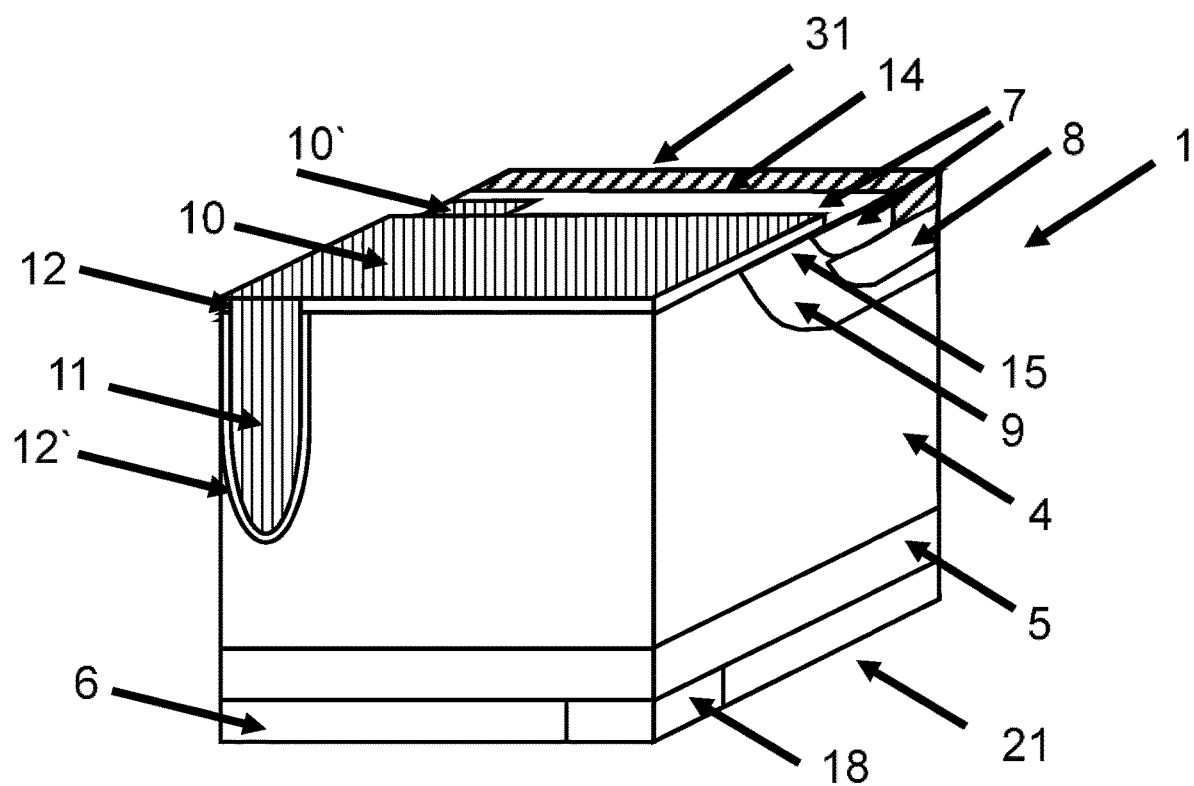
FIG. 37 shows a third example embodiment of a reverse conducting IGBT according to the invention.

The inventive design is especially suitable for reverse conducting structure by introducing n type dopants at the collector side to produce collector shorts 18 and an internal anti-parallel diode structure as shown in FIG. 37.

Figure 38:
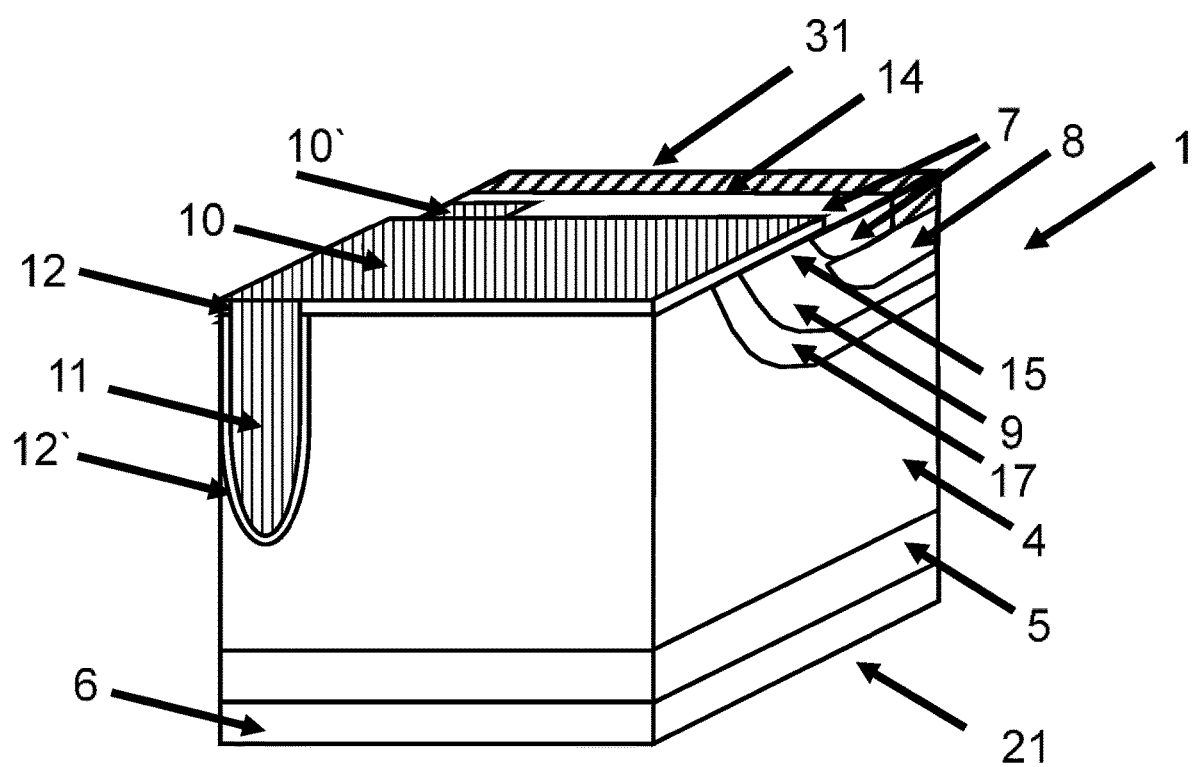
FIG. 38 shows a fourth example embodiment of a punch through IGBT with n-enhancement layer according to the invention The reference symbols used in the figures and their meaning are summarized in the list of reference symbols. The drawings are only schematically and not to scale. Generally, alike or alike-functioning parts are given the same reference symbols. The described embodiments are meant as examples and shall not confine the invention.

An enhancement layer or fourth dopants of lightly doped n conductivity type can be implanted and diffused before the first dopants implant as shown in FIG. 38. The fourth dopants of n conductivity type are implanted into the substrate 4 using the structured gate electrode layer with its opening as a mask, resulting in a fourth implant region 17.

Afterwards, the implanted fourth dopants are diffused into the substrate 4. The fourth dopants are preferably Phosphorous ions. The fourth dopants are preferably implanted with an energy of 20-100 keV and/or a dose of $5 \times 10^{12}/cm^2$ to $5 \times 10^{13}/cm^2$. The fourth dopants are driven into a maximum depth between 2 μm and 8 μm, in particular between 2 and 6 μm and in particular between 2 and 4 μm. As shown in FIG. 38, the fourth dopants are not only driven into the substrate 4 in a direction perpendicular to the surface, but they are spread out laterally.

It is possible to apply the invention to a method for the manufacturing of semiconductor devices, in which the conductivity type of all layers is reversed, i.e. with a lightly p doped substrate etc.

REFERENCE LIST

1: inventive planar MOS cell power semiconductor device
3: emitter metallization (electrode)
31: emitter side
2: collector metallization (electrode)
21: collector side
4: drift layer, substrate
5: buffer layer
6: collector layer
7: n source region
8: p second base layer
9: p first base layer
10: planar gate electrode, electrically conductive layer
10': uncovered gate electrode
11: trench gate electrode, electrically conductive layer
11': trench region
12: gate oxide for planar gate
12': gate oxide for trench gate
13: insulation layer for planar cell and trench cell
14: emitter contact opening
15: horizontal channel for planar gate
16: vertical channel for trench gate
17: enhancement layer
18: collector shorts
70: source implantation step
80: second base implantation step
90: first base implantation step
100: electrically conductive layer etch mask
110: electrically conductive layer etch mask opening
111: trench etch mask opening
140: contact etch mask
141: contact etch mask opening
200: planar MOS cell power semiconductor device (prior art)
300: trench MOS cell power semiconductor device (prior art)
400: trench planar MOS cell power semiconductor device (prior art)
401: trench planar MOS cell power semiconductor device (prior art)
500: trench planar MOS cell power semiconductor device (prior art)
600: trench planar MOS cell power semiconductor device (prior art)
700: trench planar MOS cell power semiconductor device (prior art)
800: planar MOS cell power semiconductor device (prior art)

The invention claimed is:

1. A power semiconductor device comprising:
a first surface and a second surface separated in a first dimension, wherein
an emitter electrode is operatively connected to the first surface and a collector electrode is operatively connected to the second surface;
a drift layer of a first conductivity type located between the first surface and the second surface;
a first base layer of a second conductivity type located between the drift layer and the emitter electrode;
a source region of the first conductivity type located within the first base layer and operatively connected to the emitter electrode, wherein a doping concentration of the source region is greater than a doping concentration of the drift layer;
a second base layer of the second conductivity type located within the first base layer and below the source region, wherein a doping concentration of the second base layer is greater than a doping concentration of the first base layer, wherein a first end of the second base layer is at a similar geometrical position as a first end of the source region in a second dimension and a second end of the second base layer extends beyond a second end of the source region in the second dimension, wherein at least a portion of the second base region is operatively connected to the emitter electrode via a contact opening embedding the emitter electrode;
a first gate electrode located over the first base layer, the source region and the drift layer, wherein the first gate electrode is electrically insulated from the first base layer, the source region and the drift layer by a first insulating layer;
a plurality of trench regions each comprising a second gate electrode and a second insulating layer, the second insulating layer electrically insulating the second gate electrode from the first base layer, the second base layer, the source region and the drift layer, wherein each trench region is located at least partially within the first base layer and a length of each trench region extends into the drift layer in the second dimension;
wherein the second base layer is configured to prevent the formation of a first channel in the first dimension between the emitter electrode and the drift layer; and wherein the emitter electrode and the drift layer are separated in the second dimension by the first base layer and the source region, wherein the power semiconductor device is configured to form a second channel between the emitter electrode and the drift layer in the second dimension,
wherein
each of the plurality of trench regions are shaped with respective stripes;
the first base layer, the source region and the second base layer are shaped with respective stripes in orthogonal direction to the respective stripes of the trench regions; and
the respective stripes of the first base layers, source region and second base layer are interrupted by the respective stripes of the trench regions, or the respective stripes of the plurality of trench regions are interrupted by the respective stripes of the first base layer, the source region and the second base layer.

2. The power semiconductor device according to claim 1, wherein the first gate electrode and at least one of the plurality of second gate electrodes are electrically connected.

3. The power semiconductor device according to claim 1, wherein at
least one of the plurality of second gate electrodes is electrically connected to the emitter electrode.

4. The power semiconductor device according to claim 1, wherein at
least one of the plurality of second gate electrodes is electrically floating.

5. The power semiconductor device according to claim 1, further comprising at least one of:
a buffer layer of the first conductivity type located between the drift layer and the second surface, wherein a doping concentration of the buffer layer is greater than the doping concentration of the drift layer; and
a collector layer of the second conductivity type located between the drift layer and the second surface.

6. The power semiconductor device according to claim 5, wherein the buffer layer is located between the drift layer and the collector layer.

7. The power semiconductor device according to claim 5, wherein the power semiconductor device is a reverse conducting power semiconductor device and the collector layer further comprises alternating first and second type conductivity regions located between the buffer layer and the second contact electrode.

8. The power semiconductor device according claim 1, wherein an enhancement layer of the first conductivity type is located between the drift layer and the first base layer.

9. The power semiconductor device according to claim 1, wherein a distance between adjacent trench regions of the plurality of trench regions in a third dimension, orthogonal to the first and second dimensions, is between about 5 µm and about 0.1 µm.

10. The power semiconductor device according to claim 1, wherein a distance between adjacent trench regions of the plurality of trench regions in the second dimension is between about 1 µm and about 20 µm.

* * * * *